US009312302B2

(12) United States Patent
Yamamoto et al.

(10) Patent No.: US 9,312,302 B2
(45) Date of Patent: Apr. 12, 2016

(54) LIGHT EMITTING MODULE, LIGHTING APPARATUS, AND LIGHTING FIXTURE

(71) Applicant: PANASONIC CORPORATION, Osaka (JP)

(72) Inventors: Yuuya Yamamoto, Osaka (JP); Kohji Hiramatsu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/164,493

(22) Filed: Jan. 27, 2014

(65) Prior Publication Data
US 2014/0209943 A1 Jul. 31, 2014

(30) Foreign Application Priority Data

Jan. 28, 2013 (JP) .................... 2013-013613

(51) Int. Cl.
*H01L 27/15* (2006.01)
*H01L 25/075* (2006.01)
*H01L 33/58* (2010.01)
(Continued)

(52) U.S. Cl.
CPC ............ *H01L 27/15* (2013.01); *H01L 25/0753* (2013.01); *H01L 33/58* (2013.01); *H01L 33/54* (2013.01); *H01L 33/56* (2013.01); *H01L 2924/0002* (2013.01)

(58) Field of Classification Search
CPC ......... H01L 27/15; H01L 33/58; H01L 33/56; H01L 27/32; H01L 27/3206; H01L 25/167
USPC .................................................. 257/79–103
See application file for complete search history.

(56) References Cited

U.S. PATENT DOCUMENTS

| 8,450,929 B2* | 5/2013 | Ishimori et al. ............... 313/512 |
| 8,743,166 B2* | 6/2014 | Kuroki et al. ................. 347/238 |
| 2006/0157722 A1* | 7/2006 | Takezawa et al. .............. 257/98 |

(Continued)

FOREIGN PATENT DOCUMENTS

| JP | 2005-158949 | 6/2005 |
| JP | 2010-182724 | 8/2010 |

(Continued)

OTHER PUBLICATIONS

Ishimori et al. (WO 2012/001938 A1).*

(Continued)

*Primary Examiner* — Mohammad Islam
*Assistant Examiner* — Mikka Liu
(74) *Attorney, Agent, or Firm* — Greenblum & Bernstein, P.L.C.

(57) ABSTRACT

A light emitting module is provided in which color unevenness of illumination light is difficult to occur. An optical member formed from a translucent material having a refractive index higher than air is interposed between a first light emitting part and a second light emitting part. A side surface of the optical member has a region facing a first sealing member, and the region is at least partially in contact with a surface of the first sealing member. The side surface of the optical member has a region facing a second sealing member, and the region is at least partially in contact with a surface of the second sealing member. In plan view, an upper surface of the optical member does not substantially overlap either of an upper surface of a first light emitting element or an upper surface of a second light emitting element.

30 Claims, 17 Drawing Sheets

(51) Int. Cl.
  *H01L 33/54* (2010.01)
  *H01L 33/56* (2010.01)

(56) References Cited

U.S. PATENT DOCUMENTS

| | | |
|---|---|---|
| 2007/0085103 A1 | 4/2007 | Nishioka et al. |
| 2010/0320484 A1* | 12/2010 | Hirakata et al. ........ 257/88 |
| 2011/0101384 A1* | 5/2011 | Betsuda et al. ........ 257/88 |
| 2011/0199766 A1 | 8/2011 | Shibusawa et al. |
| 2011/0199772 A1* | 8/2011 | Shibusawa et al. ...... 362/310 |
| 2011/0222264 A1 | 9/2011 | Matsuda et al. |
| 2011/0235355 A1 | 9/2011 | Seko |
| 2011/0309390 A1 | 12/2011 | Liu et al. |
| 2012/0056216 A1 | 3/2012 | Mitsuishi et al. |
| 2012/0057339 A1 | 3/2012 | Mitsuishi et al. |
| 2012/0104452 A1* | 5/2012 | Miyoshi et al. ........ 257/99 |
| 2012/0169968 A1 | 7/2012 | Ishimori et al. |
| 2012/0188772 A1 | 7/2012 | Sakai et al. |

FOREIGN PATENT DOCUMENTS

| | | |
|---|---|---|
| JP | 2011-192703 | 9/2011 |
| JP | 2012-080084 | 4/2012 |
| JP | 2012-199414 | 10/2012 |

OTHER PUBLICATIONS

Extended European Search Report for EP14152641.8 dated Dec. 15, 2014.
European Official Action for EP 14152641.8 dated Jan. 29, 2016.

* cited by examiner

LIGHT EMITTING MODULE, LIGHTING APPARATUS, AND LIGHTING FIXTURE

This application is based on application No. 2013-013613 filed in Japan, the contents of which are hereby incorporated by reference.

TECHNICAL FIELD

The present invention relates to a light emitting module including a light emitting part using light emitting elements such as LEDs (Light Emitting Diodes), a lighting apparatus, and a lighting fixture, and particularly to an art of reducing color unevenness of illumination light in mixed light illumination with use of light emitting parts of two or more types of different colors.

BACKGROUND ART

Conventionally, there has been proposed mixed light illumination with use of light emitting parts of two or more types of different colors and mixing light emitted from the light emitting parts to obtain illumination light of a desired color (Patent Literature 1). One example of such mixed light illumination is a light emitting module that includes a white light emitting part that emits white light, a red light emitting part that emits red light, and a green light emitting part that emits green light, and adjusts a luminance ratio of white light, red light, and green light to emit white light having various color temperatures.

The white light emitting part included in the light emitting module is for example composed of a blue LED and a sealing member containing a yellow phosphor and sealing the blue LED. The white light emitting part obtains white light by wavelength-converting part of blue light emitted from the blue LED to yellow light, and mixing remaining part of the blue light and the yellow light. Also, the red light emitting part included in the light emitting module is for example composed of a blue LED and a sealing member containing a red phosphor and sealing the blue LED. The red light emitting part obtains red light by wavelength-converting substantially all parts of blue light emitted from the blue LED to red light. Furthermore, the green light emitting part included in the light emitting module is for example composed of a blue LED and a sealing member containing a green phosphor and sealing the blue LED. The green light emitting part obtains green light by wavelength-converting substantially all parts of blue light emitted from the blue LED to green light.

The type of phosphor contained in a sealing member differs depending on the type of light emitting part as described above. For this reason, sealing members included in different types of light emitting parts are generally formed at intervals in a sealing member formation process such that different types of phosphors do not mix with each other. If such different types of phosphors mix with each other, hue of light emitted from the light emitting parts differs from designed hue, and this results in difficulty obtaining illumination light of a desired color.

CITATION LIST

Patent Literature

[Patent Literature 1] Japanese Patent Application Publication No. 2010-182724

SUMMARY OF INVENTION

Technical Problem

By the way, in the case where sealing members included in different types of light emitting parts are formed at intervals, the different types of light emitting parts must be arranged at intervals. As a result, since light of different colors is emitted from different positions, mixing of the light of different colors is difficult to occur. This tends to easily cause color unevenness of illumination light. In response to this problem, a cover having a light-scattering function is for example used for covering an upper part of a light emitting module. In this way, color unevenness of illumination light that occurs in the light emitting module is reduced with use of functions of a member other than the light emitting module.

With the above structure of using a cover such as described above, however, the increase in number of members causes the cost increase in lighting apparatuses and lighting fixtures, and furthermore causes complications of manufacturing process of the lighting apparatuses and the lighting fixtures. Accordingly, it is desirable that color unevenness of illumination light should be reduced in the light emitting module itself.

In view of the above problem, the present invention aims to provide a light emitting module, a lighting apparatus, and a lighting fixture in which color unevenness of illumination light is difficult to occur.

Solution to Problem

In order to achieve the above aim, one aspect of the present invention provides a light emitting module comprising a first light emitting part and a second light emitting part that are provided on an upper surface of a substrate with an interval therebetween and differ from each other in terms of luminescent color, the first light emitting part including a first light emitting element and a first sealing member sealing the first light emitting element, the second light emitting part including a second light emitting element and a second sealing member sealing the second light emitting element, wherein an optical member is interposed between the first light emitting part and the second light emitting part, and is formed from a translucent material having a refractive index higher than air, a side surface of the optical member includes a first region facing the first sealing member and a second region facing the second sealing member, the first region is at least partially in contact with a surface of the first sealing member, and the second region is at least partially in contact with a surface of the second sealing member, and in plan view, an upper surface of the optical member does not substantially overlap either an upper surface of the first light emitting element or an upper surface of the second light emitting element.

Also, in a specific phase of the light emitting module relating to the one aspect of the present invention, the first region included in the side surface of the optical member is entirely in surface contact with the surface of the first sealing member with substantially no gap therebetween, and the second region included in the side surface of the first sealing member is entirely in surface contact with the surface of the second sealing member with substantially no gap therebetween.

Also, in a specific phase of the light emitting module relating to the one aspect of the present invention, in a range between the first sealing member and the second sealing member, a lower surface of the optical member is in surface contact with the upper surface of the substrate with substantially no gap therebetween.

Also, in a specific phase of the light emitting module relating to the one aspect of the present invention, the translucent material forming the optical member is mixed with a light-scattering material.

Also, in a specific phase of the light emitting module relating to the one aspect of the present invention, the first sealing member and the second sealing member are each formed from a translucent material that is mixed with a phosphor, and the translucent material forming the optical member differs from each of the respective translucent materials forming the first sealing member and the second sealing member in terms of refractive index by 0.04 or less.

Also, in a specific phase of the light emitting module relating to the one aspect of the present invention, the optical member, the first sealing member, and the second sealing member are formed from the same translucent material.

One aspect of the present invention provides a lighting apparatus comprising the above-described light emitting module.

One aspect of the present invention provides a lighting fixture comprising the above-described light emitting module.

Advantageous Effects of Invention

According to the light emitting module relating to one aspect of the present invention, the optical member, which is formed from a translucent material having a refractive index higher than air, is provided between the first light emitting part and the second light emitting part. Also, the side surface of the optical member includes the first region facing the first sealing member and the second region facing the second sealing member. The first region is at least partially in contact with the surface of the first sealing member, and the second region is at least partially in contact with the surface of the second sealing member. With this structure, light emitted from the first light emitting part and light emitted from the second light emitting part are easy to mix with each other, and accordingly color unevenness of light emitted from the light emitting module 100 is difficult to occur. Furthermore, since the first light emitting part and the second light emitting part are provided with an interval therebetween, the phosphor included in the first sealing member and the phosphor included in the second sealing member cannot mix with each other in a sealing member formation process.

DESCRIPTION OF EMBODIMENTS

[Embodiment]

The following describes a light emitting module, a lighting apparatus, and a lighting fixture relating to one aspect of the present invention, with reference to the drawings.

<Lighting Fixture>

Figure 1:
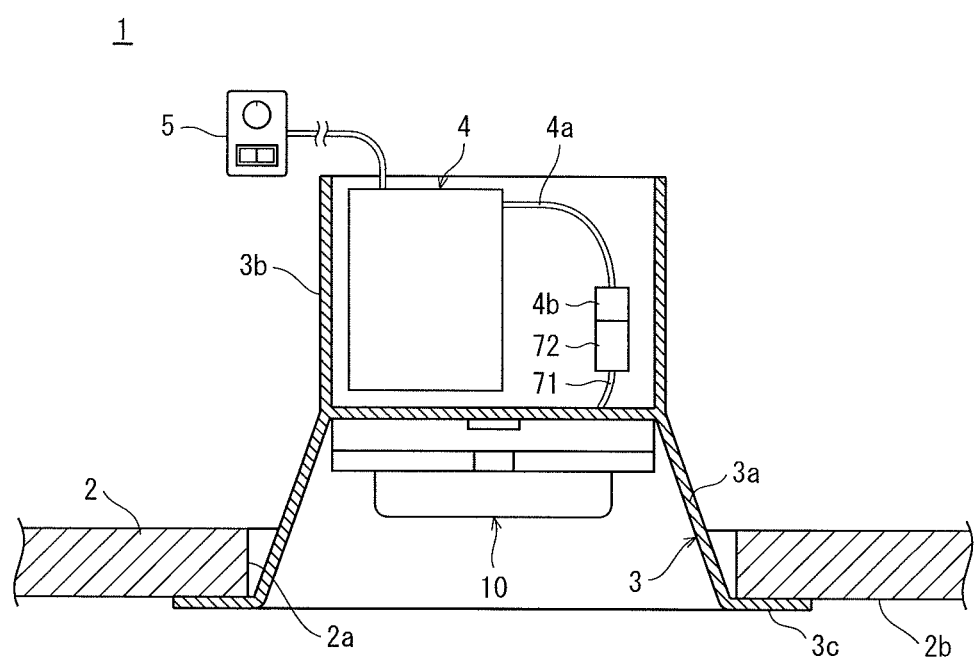
FIG. 1 is a cross-sectional view showing a lighting fixture relating to one aspect of the present invention.
Figure 2:
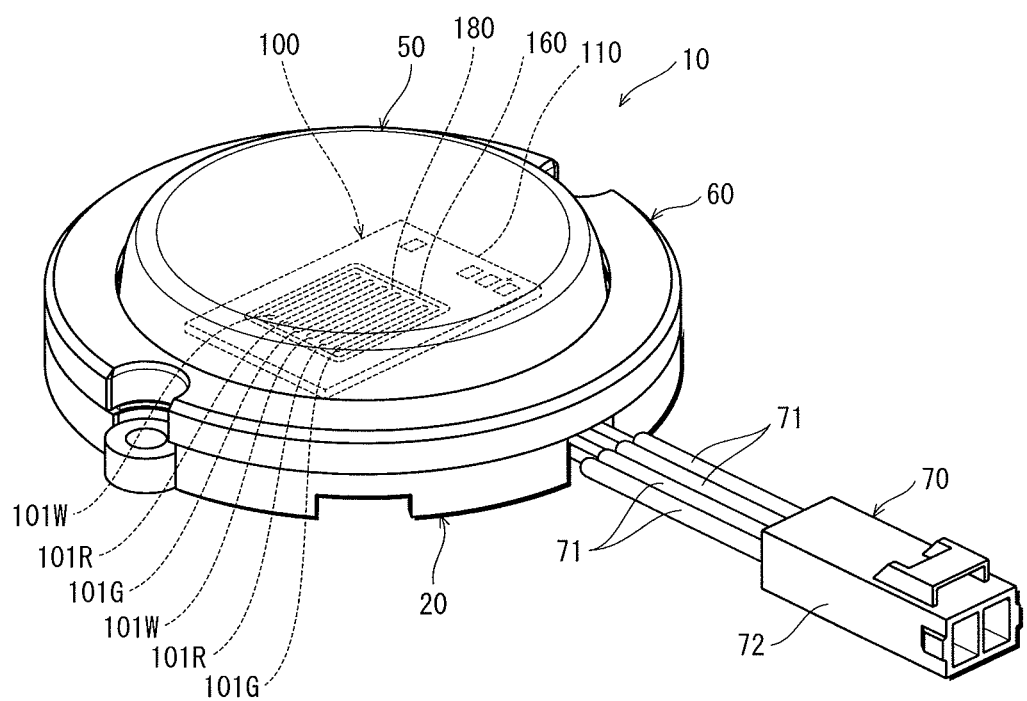
FIG. 2 is a perspective view showing a lighting apparatus relating to the one aspect of the present invention.

FIG. 1 is a cross-sectional view showing the lighting fixture relating to the one aspect of the present invention. FIG. 2 is a perspective view showing the lighting apparatus relating to the one aspect of the present invention. As shown in FIG. 1, a lighting fixture 1 relating to the one aspect of the present invention is for example a downlight which is embedded into the ceiling 2 to be attached to the ceiling 2, and includes a lighting appliance 3, a circuit unit 4, a dimming unit 5, and further includes a lighting apparatus 10 shown in FIG. 2.

The lighting appliance 3 is for example metal, and includes a lamp housing 3a, and a circuit housing 3b and an outer flange 3c. The lamp housing 3a is for example cylindrical and bottomed. The lighting apparatus 10 is detachably attached inside the lamp housing 3a. The circuit housing 3b for example extends toward a bottom of the lamp housing 3a, and houses therein the circuit unit 4. The outer flange 3c is for example circularly annular, and extends outward from an opening of the lamp housing 3a. The lighting appliance 3 is attached to the ceiling 2. Specifically, the lamp housing 3a and the circuit housing 3b are embedded into an embedding hole 2a formed in the ceiling 2, and then the lamp housing 3a and the circuit housing 3b are attached to the ceiling 2 by attachment springs or the like (not illustrated) while the outer flange 3c is in abutment with the periphery of the embedding hole 2a on a lower surface 2b of the ceiling 2.

The circuit unit 4 is for lighting the lighting apparatus 10, and includes a power line 4a that is electrically connected with the lighting apparatus 10. The front edge of the power line 4a has attached thereto a connector 4b that is detachably connected with connectors 72 of lead wires 71 of the lighting apparatus 10.

The dimming unit 5 is used by a user to adjust luminance of illumination light of the lighting apparatus 10. The dimming unit 5 is electrically connected with the circuit unit 4. In response to the user's operation, the dimming unit 5 outputs a dimming signal to the circuit unit 4.

<Lighting Apparatus>

Figure 3:
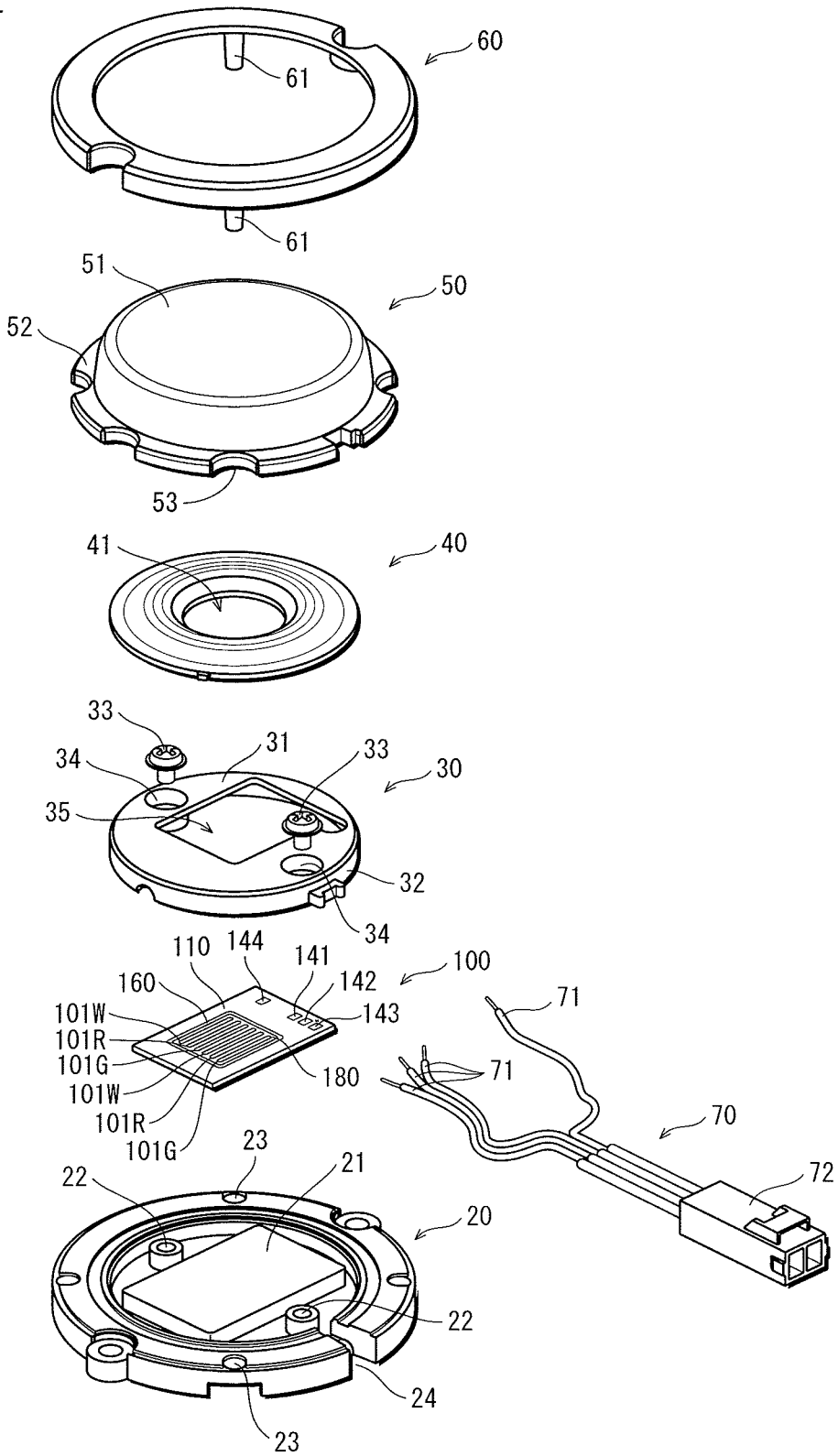
FIG. 3 is an exploded perspective view showing the lighting apparatus relating to the one aspect of the present invention.

FIG. 3 is an exploded perspective view showing the lighting apparatus relating to the one aspect of the present invention. As shown in FIG. 3, the lighting apparatus 10 relating to the one aspect of the present invention is for example a lamp unit, and includes a base 20, a holder 30, a decorative cover 40, a cover 50, a cover hold-down member 60, a wiring member 70, a light emitting module 100, and so on.

The base 20 is for example formed from a die-cast aluminum and is discoid. The base 20 has, at the center on a side of an upper surface thereof, a mounting part 21 on which the light emitting module 100 is mounted. The base 20 has, on the side of the upper surface, screw holes 22 facing each other with the mounting part 21 therebetween. An assembling screw 33 is to be screwed into each of the screw holes 22 to fix the holder 30. Also, the base 20 has boss holes 23 and a cut part 24 on a marginal part thereof.

The holder 30 is for example cylindrical and bottomed, and includes a hold-down plate part 31 that is discoid and a peripheral wall part 32 that is cylindrical and extends from the peripheral edge of the hold-down plate member 31 toward the base 20. The hold-down plate part 31 has, on a marginal part thereof, through holes 34 through which the respective assembling screws 33 are to be inserted so as to correspond in position to the screw holes 22 of the base 20. The holder 30 is attached to the base 20 by screwing the assembling screws 33, which have been inserted through the respective screw through holes 34, further into the respective screw holes 22 of the base 20 while the light emitting module 100 is held down to the mounting part 21 by the hold-down plate part 31. While the holder 30 is attached to the base 20, light emitting parts 101W, 101R, and 101G that are included in the light emitting module 100 are exposed through a window hole 35 that is formed on the center of the hold-down plate part 31.

The decorative cover 40 is for example circularly annular and is formed from a non-translucent material such as an opaque white resin. The decorative cover 40 is disposed between the holder 30 and the cover 50, and covers the lead wires 71, the assembling screws 33, and so on. The decorative cover 40 has, on the center thereof, a window hole 41 through which the light emitting parts 101W, 101R, and 101G of the light emitting module 100 are to be exposed.

The cover 50 is for example formed from a translucent material such as a silicone resin, an acrylic resin, and a glass. Light emitted from the light emitting module 100 is extracted outside the lighting apparatus 10 after transmitting through the cover 50. The cover 50 includes a main part 51 and an outer flange 52. The main part 51 has a dome shape, covers the light emitting parts 101W, 101R, and 101G, and has lens functions. The outer flange 52 extends outward from a circumferential part of the main part 51, and is fixed to the base 20. The outer flange 52 has semi-circular cut parts 53 in one-to-one correspondence in position with boss parts 61 of the cover hold-down member 60 so as to avoid the boss parts 61.

The cover hold-down member 60 is for example formed from a non-translucent material including a metal such as an aluminum and an opaque white resin, and is annular and plate-like so as not to shield light emitted through the main part 51 of the cover 50. The cover hold-down member 60 has, on a side of a lower surface thereof, the boss parts 61 that are each columnar and extend toward the base 20. The cover hold-down member 60 is fixed to the base 20 by inserting the boss parts 61 of the cover hold-down member 60 through the respective boss holes 23 of the base 20, irradiating respective front edges of the boss parts 61 with a laser beam from the underside of the base 20, and plastic-deforming the front edges of the boss parts 61 so as not to fall out of the respective boss holes 23.

The wiring member 70 includes a set of the lead wires 71 that are each electrically connected with the light emitting module 100. The lead wires 71 each have attached thereto the connector 72 at an end thereof opposite to an end thereof which is connected with the light emitting module 100. The lead wires 71 of the wiring member 70, which are connected with the light emitting module 100, are led outside the lighting apparatus 10 via the cut part 24 of the base 20.

<Light Emitting Module>

Figure 4A:
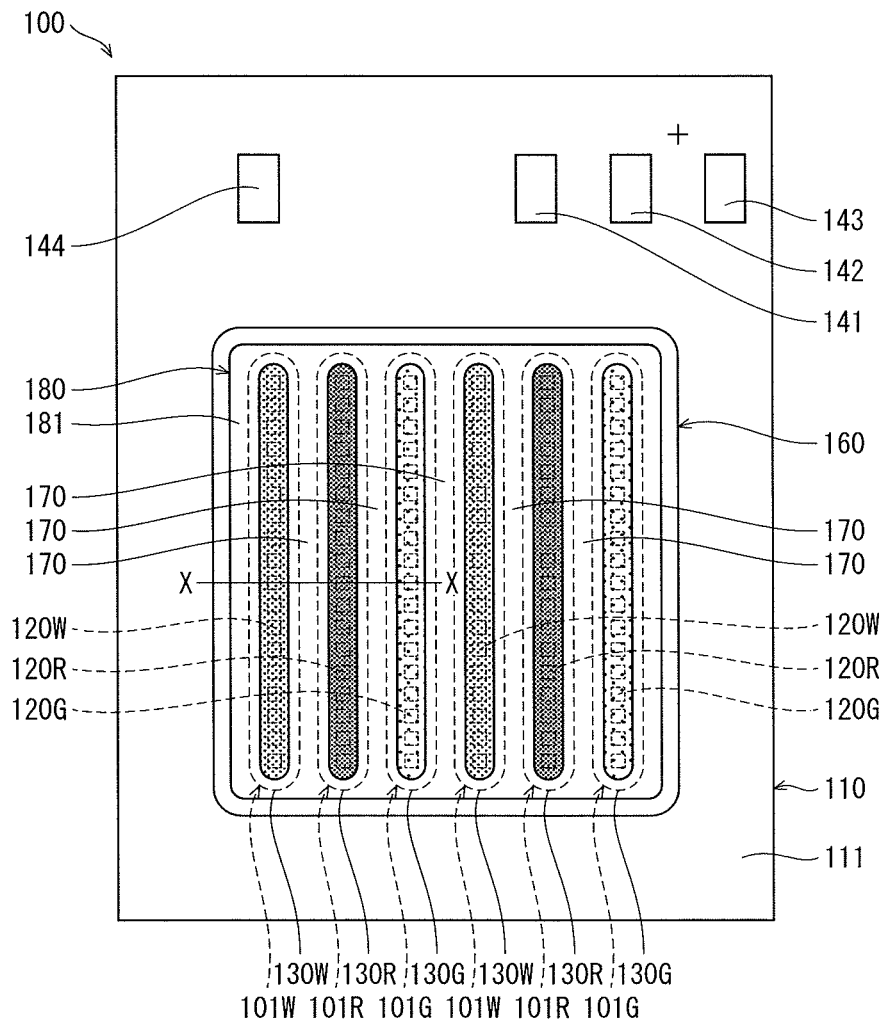
FIG. 4A is a plan view showing a light emitting module relating to the one aspect of the present invention.
Figure 4B:
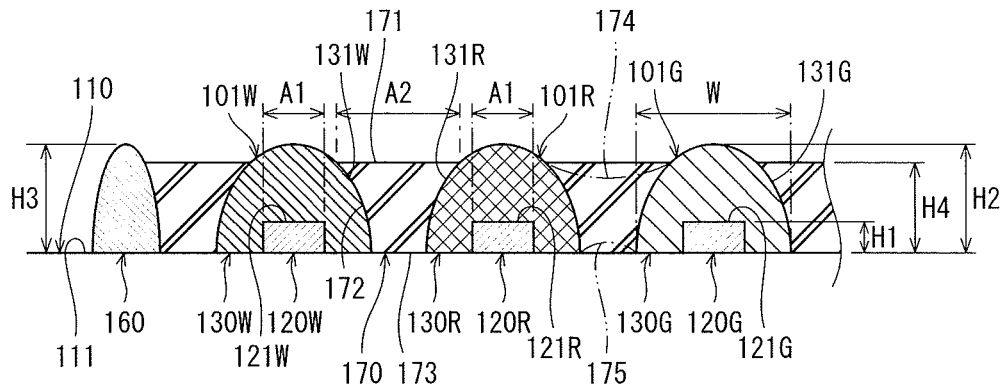
FIG. 4B is a cross-sectional view showing the light emitting module taken along a line X-X in FIG. 4A.
Figure 5:
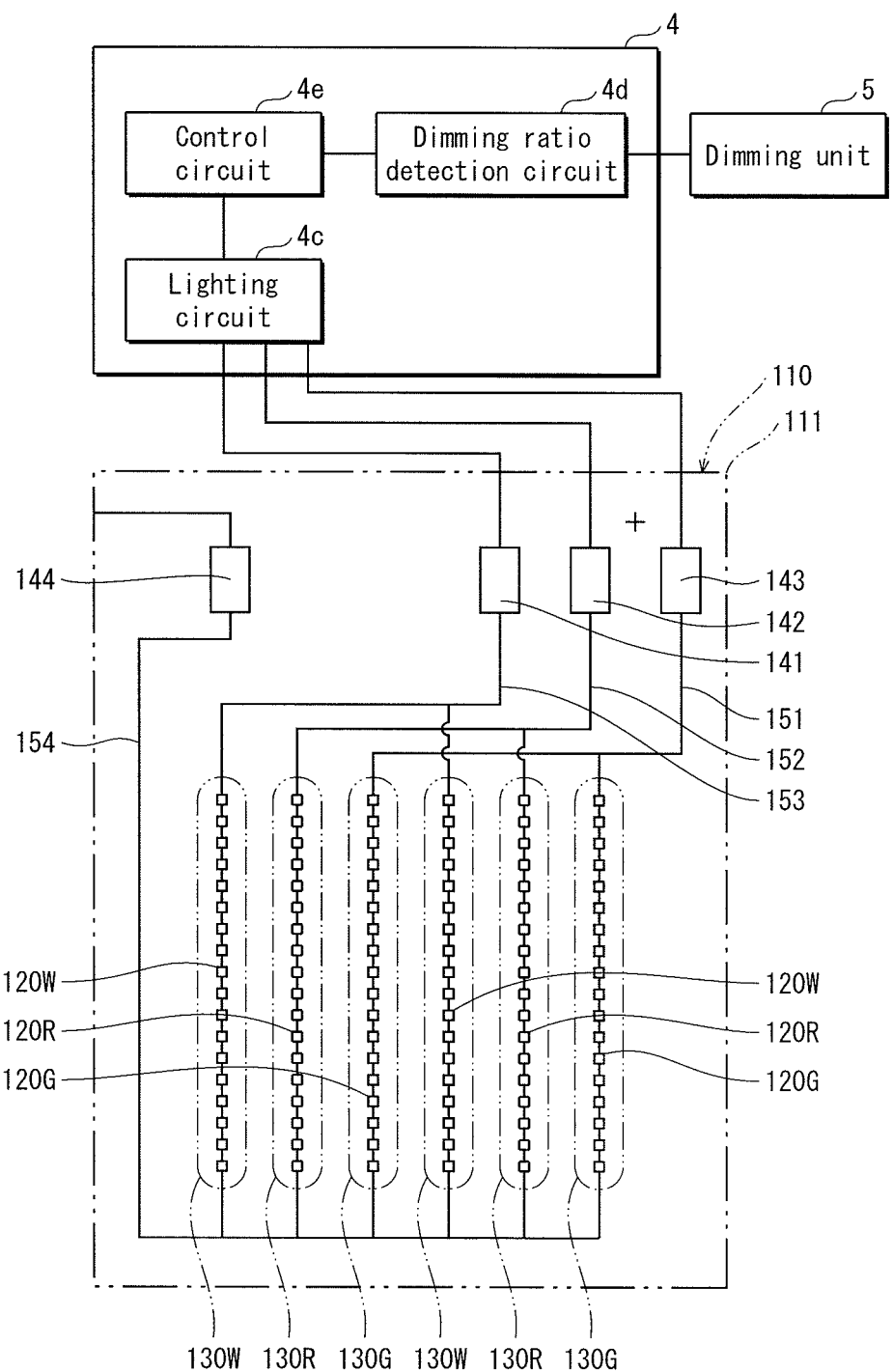
FIG. 5 is a wiring diagram for describing a connection status of light emitting elements relating to the one aspect of the present invention.

FIG. 4A is a plan view showing a light emitting module relating to the one aspect of the present invention, and FIG. 4B is a cross-sectional view showing the light emitting module taken along a line X-X in FIG. 4A. FIG. 5 is a wiring diagram for describing a connection status of light emitting elements relating to the one aspect of the present invention. As shown in FIG. 4A, the light emitting module 100 includes a substrate 110, the light emitting elements 120W, 120R, and 120G, sealing members 130W, 130R, and 130G, terminal parts 141 to 144, wires 151 to 154 (see FIG. 5), a frame 160, and an optical member assembly 180 including a plurality of optical members 170.

The substrate 110 is for example a substantially rectangular plate, and has a double-layered structure including an insulating layer such as a ceramic substrate and a heat conductive resin and a metal layer such as an aluminum substrate. The substrate 110 has provided, on an upper surface 111 thereof, six light emitting parts at intervals, namely, two first light emitting parts 101W that emit white light, two second light emitting parts 101R that emit red light, and two third light emitting parts 101G that emit green light. The light emitting parts 101W, 101R, and 101G are each elongated, and are arranged in parallel at regular intervals such that respective ends of the light emitting parts 101W, 101R, and 101G are aligned with each other. More specifically, the light emitting parts are arranged in the following order: the first light emitting part 101W, the second light emitting part 101R, the third light emitting part 101G, the first light emitting part 101W, the second light emitting part 101R, and the third light emitting part 101G from the left side in FIG. 4A, such that the light emitting parts that emit light of the same color are not directly adjacent to each other. Note that the light emitting parts 101W, 101R, and 101G are represented by different types of hatching for each luminescent color in FIG. 4A such that luminescent colors are distinguishable.

The first light emitting parts 101W are each composed of a plurality of first light emitting elements 120W that are linearly arranged and one first sealing member 130W that seals the first light emitting elements 120W. The second light emitting parts 101R are each composed of a plurality of second light emitting elements 120R that are linearly arranged and one second sealing member 130R that seals the second light emitting elements 120R. The third light emitting parts 101G are each composed of a plurality of third light emitting elements 120G that are linearly arranged and one third sealing member 130G that seals the third light emitting elements 120G. The light emitting elements 120W, 120R, and 120G, which are respectively included in the light emitting parts 101W, 101R, and 101G, are each 18 in number.

The light emitting elements 120W, 120R, and 120G are each a blue LED that emits blue light having a peak wavelength of 450 nm to 470 nm, and are face-up mounted on the upper surface 111 of the substrate 110 with use of the COB (Chip on Board) technique. The light emitting elements 120W, 120R, and 120G are each substantially square in plan view (when viewed from above), and for example each have a height H1 of 0.1 mm in a direction perpendicular to the upper surface 111 of the substrate 110 (hereinafter, referred to just as height) as shown in FIG. 4B.

Returning to FIG. 4A, the sealing members 130W, 130R, and 130G are each for example elongated, and all have the same shape. Accordingly, the light emitting parts 101W, 101R, and 101G all have the same shape. Specifically, the light emitting parts 101W, 101R, and 101G each have substantially a semi-elliptical cross section cut along a virtual plane perpendicular to the longitudinal direction of the sealing members 130W, 130R, and 130G. Also, the sealing members 130W, 130R, and 130G each have for example a width W of 1.7 mm in the short direction thereof, a height H2 of 1.0 mm, and an aspect ratio (W/H2) of less than two of the substantially semi-ellipse. Since the aspect ratio is less than two, the cross-section of each of the light emitting parts 101W, 101R, and 101G has a substantially semi-elliptical shape that is formed by flattening an ellipse so as to increase in diameter upward and downward and dividing the ellipse in half up and down to leave only the upper half.

Figure 6:
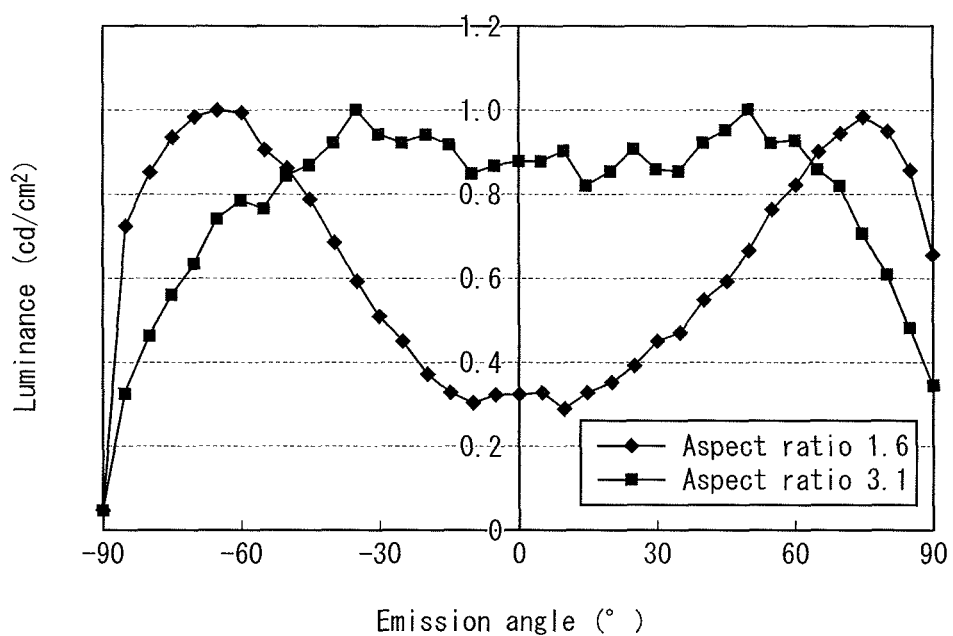
FIG. 6 shows an influence of an aspect ratio on light distribution properties.

FIG. 6 shows an influence of an aspect ratio on light distribution properties. As shown in FIG. 6, in the case where the light emitting parts 101W, 101R, and 101G each have substantially a semi-elliptical cross section, cut along a virtual plane perpendicular to the longitudinal direction of the sealing members 130W, 130R, and 130G, having an aspect ratio of less than two, light emitted directly upward from each of the light emitting elements 120W, 120R, and 120G (light having an emission angle of 0°) has a low luminance relative to the entire emitted light, compared with a semi-circular cross section having an aspect ratio of two or more. Also, light emitted obliquely upward (light having an emission angle of more than −90° and less than 0° and light having an emission angle of more than 0° and less than 90°) each have a high luminance relative to the entire emitted light, compared with a semi-circular cross section having an aspect ratio of two or more. Light emitted obliquely upward is easier to mix with light emitted from any adjacent of the light emitting elements 120W, 120R, and 120G than light emitted directly upward is. Accordingly, increase in relative luminance of light emitted obliquely upward improves color mixing properties of the light emitting module 100.

The sealing members 130W, 130R, and 130G are each for example formed from a translucent material mixed with a wavelength conversion material, and function as respective wavelength conversion members for wavelength-converting light emitted from the light emitting elements 120W, 120R, and 120G. The sealing members 130W, 130R, and 130G are formed the same translucent material, specifically, formed from translucent materials having the same refractive index. The translucent material may be a translucent resin such as a silicone resin, an epoxy resin, a fluoro resin, a silicone epoxy hybrid resin, and a urea resin. The wavelength conversion material may be an oxynitride phosphor such as a sialon phosphor, a sulfide phosphor, a silicate phosphor, or the like, or a mixture of at least two types of these phosphors.

The first sealing members 130W for example each include a yellow phosphor as a wavelength conversion material. Part of blue light emitted from the first light emitting elements 120W is converted by the first sealing members 130W to yellow light having a peak wavelength of 535 nm to 555 nm for example. As a result of mixing remaining part of the blue light which has not been converted and the yellow light after conversion, the light emitting parts 101W as a whole emit white light. The second sealing members 130R for example each include a red phosphor as a wavelength conversion material. Substantially all of blue light emitted from the second light emitting elements 120R is converted by the second sealing members 130R to red light having a peak wavelength of 610 nm to 700 nm for example. The light emitting parts 101R as a whole emit red light. The third sealing members 130G for example each include a green phosphor as a wavelength conversion material. Substantially all of blue light emitted from the third light emitting elements 120G is converted by the third sealing members 130G to green light having a peak wavelength of 515 nm to 570 nm for example. The light emitting parts 101G as a whole emit green light. White light, red light, and green light, which are respectively emitted from the first light emitting parts 101W, the second light emitting parts 101R, and the third light emitting parts 101G, mix with each other while luminance ratio thereof are adjusted. This allows the light emitting module 100 as a whole to emit white light that has various color temperatures.

Returning to FIG. 5, the terminal parts 141 to 144 are formed on a peripheral part on the upper surface 111 of the substrate 110 with a conductor pattern. The terminal parts 141 and 144 feed an electrical power to the first light emitting elements 120W. The terminal parts 142 and 144 feed an electrical power to the second light emitting elements 120R. The terminal parts 143 and 144 feed an electrical power to the third light emitting elements 120G. The terminal parts 141 to 144 are each connected with a lighting circuit 4c of a circuit unit 4 via the respective lead wires 71.

The wires 151 and 154 make so-called series and parallel connection of the first light emitting elements 120W by connecting two series of 18 first light emitting elements 120W in parallel. The wires 152 and 154 make series and parallel connection of the first light emitting elements 120R by connecting two series of 18 first light emitting elements 120R in parallel. The wires 153 and 154 make series and parallel connection of the first light emitting elements 120G by connecting two series of 18 first light emitting elements 120G in parallel. With the above structure of electrical connection, it is possible to supply an electrical current by an independent system to each of the first light emitting elements 120W, the second light emitting elements 120R, and the third light emitting elements 120G.

The circuit unit 4 separately controls lighting of the first light emitting elements 120W, the second light emitting elements 120R, and the third light emitting elements 120G. The circuit unit 4 includes the lighting circuit 4c, a dimming ratio detection circuit 4d, and a control circuit 4e. The circuit unit 4 is electrically connected with an external commercial AC source (not illustrated), and supplies an electrical current that is supplied by the commercial AC source to the light emitting module 100. The lighting circuit 4c includes an AC/DC converter, and converts an AC voltage that is supplied by the commercial AC source to a DC voltage, and applies the DC voltage to the light emitting elements 120W, 120R, and 120G in accordance with an instruction issued by the control circuit 4e. The dimming ratio detection circuit 4d acquires a dimming signal including dinning ratio information that is output by the dimming unit 5. The control circuit 4e performs PWM control on the light emitting elements 120W, 120R, and 120G based on the dimming ratio.

As shown in FIG. 4A, the frame 160 is for example substantially rectangularly annular, and is provided on the upper surface 111 of the substrate 110 so as to surround the light emitting parts 101W, 101R, and 101G. As shown in FIG. 4B, the frame 160 has a height H3 that is substantially equal to the height H2 of the sealing members 130W, 130R, and 130G, and is greater than a height H4 of the optical members 170. The frame 160 keeps the shape of the optical member assembly 180 before solidification. Note that the frame 160 is not necessarily necessary for the light emitting module relating to the present invention. The frame 160 may not be provided.

(Optical Member)

Returning to FIG. 4A, the optical member assembly 180 is composed of five optical members 170 and a connecting member 181. The optical members 170 are each elongated, and are each interposed between any adjacent light emitting parts 101W, 101R, and 101G. The connecting member 181 is substantially rectangularly annular, and surrounds all the optical members 170 and all the light emitting parts 101W, 101R, and 101G. Specifically, the optical members 170 are each interposed between adjacent first light emitting part 101W and second light emitting part 101R, between adjacent second light emitting part 101R and third light emitting part 101G, or between adjacent first light emitting part 101W and third light emitting part 101G. The optical members 170 are each connected, at both ends thereof, with the connecting member 181. The optical member assembly 180 having such a shape is formed by, for example, after formation of the light emitting parts 101W, 101R, and 101G and the frame 160, pouring a liquid translucent material into mainly a region inside the frame 160 where the light emitting parts 101W, 101R, and 101G are not formed, and solidifying the liquid translucent material. The optical members 170 are connected with each other via the connecting member 181, and this enables to easily form a plurality of optical members 170 at one time.

The optical member assembly 180 is formed from a translucent material having a refractive index higher than air. In other words, the optical members 170 are formed from a translucent material having a refractive index higher than air. In the present application, air has a refractive index of 1.000292 (at 0 degree Celsius and atmospheric pressure of 1).

As described above, the optical members 170 are each interposed between any adjacent light emitting parts 101W, 101R, and 101G. Accordingly, there is a small difference in terms of refractive index between the inside and the outside of the sealing members 130W, 130R, and 130G with respective surfaces 131W, 131R, 131G therebetween, compared with the case where air is interposed between each adjacent light emitting parts 101W, 101R, and 101G. The small difference in terms of refractive index enables light to easily enter, on an interface between each of the sealing members 130W, 130R, and 130G and the optical members 170, from each of the sealing members 130W, 130R, and 130G toward the inside of the optical members 170. As a result, light emitted from each adjacent light emitting parts 101W, 101R, and 101G is easy to mix with each other inside the optical member 170, and accordingly color unevenness of light emitted from the light emitting module 100 is reduced.

In the present embodiment, since the same type of translucent materials are used for the optical member assembly 180 and the sealing members 130W, 130R, and 130G, the respective translucent materials forming the optical members 170 and the sealing members 130W, 130R, and 130G all have the same refractive index. The same refractive index enables light to easily enter, on an interface between each of the optical members 170 and each of the sealing members 130W, 130R, and 130G, from each of the sealing members 130W, 130R, and 130G toward the inside of the optical members 170. As a result, light emitted from each adjacent light emitting parts 101W, 101R, and 101G is further easy to mix with each other inside the optical member 170, and accordingly color unevenness of light emitted from the light emitting module 100 is further reduced.

Figure 7A:
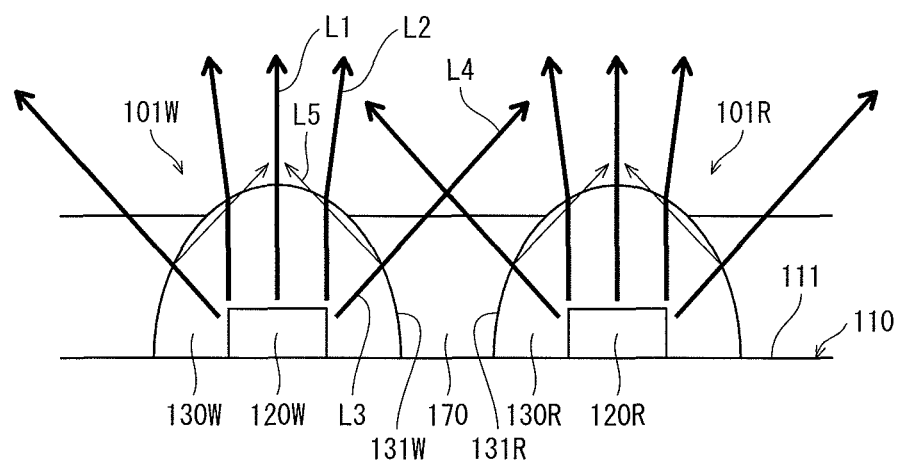
FIG. 7A and FIG. 7B are pattern diagrams for describing the color mixing properties of the light emitting module relating to the one aspect of the present invention, and respectively show color mixing in the lighting apparatus relating to the one aspect of the present invention and a conventional lighting apparatus.
Figure 7B:
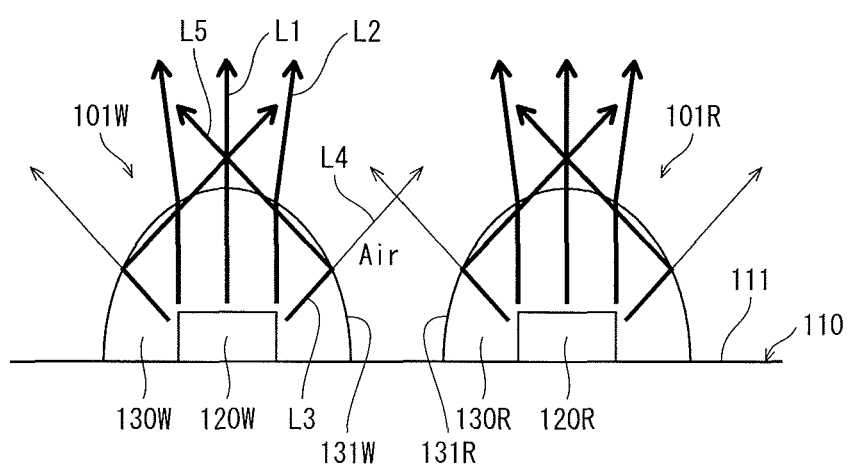

FIG. 7A and FIG. 7B are pattern diagrams for describing the color mixing properties of the light emitting module relating to the one aspect of the present invention, and respectively show color mixing in the lighting apparatus relating to the one aspect of the present invention and a conventional lighting apparatus. As shown in FIG. 7A and FIG. 7B, light traveling along an optical path L1 and light traveling along an optical path L2, which are emitted from the light emitting element 120W directly upward (in a direction perpendicular to the upper surface 111 of the substrate 110), pass through mainly the surface 131W and travel directly upward or obliquely upward that is nearly directly upward. Most part of each of the light traveling along the optical path L1 and the light traveling along the optical path L2 does not mix with light emitted from the adjacent light emitting part 101R. This applies equally to both the structure of the present embodiment and the conventional structure.

Compared with this, light traveling along an optical path L3, which is emitted from the light emitting element 120W toward the adjacent light emitting part 101R, is greatly divided to light traveling along an optical path L4 and light traveling along an optical path L5. The light traveling along the optical path L4 passes through the surface 131W, and enters the inside of the optical member 170. The light traveling along the optical path L5 is reflected by the surface 131W, and returns to the inside of the sealing member 130W. The structure of the present embodiment greatly differs from the conventional structure in terms of ratio of light traveling along the optical path L4 and light traveling along the optical path L5.

In the structure of the present embodiment as shown in FIG. 7A, the sealing member 130W and the optical member 170 having the surface 131W therebetween are equal to each other in terms of refractive index, and accordingly a ratio of the light traveling along the optical path L4 is large. Compared with this, in the case where not the optical member 170 but air is interposed between the light emitting part 101W and the light emitting part 101R as shown in FIG. 7B, the sealing member 130W and the optical member 170 having the surface 131W therebetween greatly differ from each other in terms of refractive index, and accordingly a ratio of the light traveling along the optical path L4 is small. The light traveling along the optical path L4 mixes with light emitted from the adjacent light emitting part 101R, at a position closer to a light source than the light traveling through the optical path L5 mixes. Therefore, the structure of the present embodiment in which the ratio of the light traveling along the optical path L4 is small exhibits higher color mixing effects and lower color unevenness of illumination light than the conventional structure.

Note that the translucent material forming the optical members 170 does not necessarily need to have the same refractive index as each of the respective translucent materials forming the sealing members 130W, 130R, and 130G. However, in order to realize the structure of enabling light emitted from the light emitting parts 101W, 101R, and 101G to enter the inside of the optical members 170, there should preferably be a small difference in terms of refractive index between the translucent material forming the optical members 170 and each of the respective translucent materials forming the sealing members 130W, 130R, and 130G. Specifically, there should preferably be a difference of 0.04 or less in terms of refractive index between the translucent material forming the optical members 170 and each of the respective translucent materials forming the sealing members 130W, 130R, and 130G.

As shown in FIG. 4B, the optical member 170 should have a side surface 172 whose region facing the first sealing member 130W is at least partially in contact with the surface 131W of the first sealing member 130W. This enables light to easily enter, in a part where the optical member 170 is in contact with the first sealing member 130, from the first sealing member 130W toward the inside of the optical member 170. The region included in the side surface 172 of the optical member 170, which faces the first sealing member 130W, should preferably be entirely in surface contact with the surface 131W of the first sealing member 130W with substantially no gap therebetween. This is because the larger an area of the region that is in surface contact is, the more easily light enters from the first sealing member 130W toward the inside of the optical member 170. Note that the expression "with substantially no gap therebetween" means an unexpected gap such as an air bubble is not considered as a gap here.

The optical member 170 has an upper surface 171 that is flat. The upper surface 171 of the optical member 170 is not limited to be flat. The upper surface 171 of the optical member 170 is not limited to be flat. Alternatively, as indicated by two-dot chain lines 174 in FIG. 4B, the optical member 170 may have an arc cross section cut along a virtual plane perpendicular to the longitudinal direction of the sealing members 130W, 130R, and 130G, where the upper surface 171 expands toward the substrate 110.

The optical member 170 is formed such that, in plan view, the upper surface 171 does not substantially overlap either of the respective upper surfaces 121W, 121R, and 121G of the light emitting elements 120W, 120R, and 120G. In other words, a region A1 where the respective upper surfaces 121W, 121R, and 121G of the light emitting elements 120W, 120R, and 120G are positioned does not substantially overlap, in plan view, a region A2 where the upper surface 171 of the optical member 170 is positioned. Accordingly, as shown in FIG. 7A, light traveling along the optical path L1 and light traveling along the optical path L2, which are emitted from the light emitting element 120W directly upward, that is, in a main light emission direction, are output from the surface 131W of the sealing member 130W without entering the inside of the optical member 170, and then are externally extracted. With this structure, light attenuation due to the optical member 170 does not occur, and therefore a high light extraction efficiency of the light emitting elements 120W, 120R, and 120G is exhibited.

Returning to FIG. 4B, the optical members 170 for example each have the height H4 of 0.8 mm. The optical member 170 should preferably have the height H4 as great as possible, within a range where the upper surface 171 of the optical member 170 does not substantially overlap either of the respective upper surfaces 121W, 121R, and 121G of the light emitting elements 120W, 120R, and 120G in plan view. As the height H4 of the optical member 170 increases, a contact area between the optical member 170 and each of the sealing members 130W, 130R, and 130G tends to increase. This causes light emitted from the light emitting parts 101W, 101R, and 101G to easily enter the inside of the optical member 170. As a result, great mixing light effects tends to be exhibited. Furthermore, in order to prevent the surface 131W of the sealing member 130W from totally reflecting light that enters from the light emitting part 101W toward the inside of the optical member 170, the optical member 170 should preferably have the height H4 that is enough to largely secure an entry angle of light.

The optical members 170 each should preferably have a lower surface 173 that is in surface contact with the upper surface 111 of the substrate 110 with substantially no gap therebetween, in a range between each adjacent sealing members 130W, 130R, and 130G. This is because if there is a gap between the lower surface 173 of the optical member 170 and the upper surface 111 of the substrate 110, light that enters the inside of the optical member 170 changes to stray light and this causes decrease in luminance. Note that, however, the lower surface 173 may come off the upper surface 111 of the substrate 110 with a gap therebetween, as indicated by two-dot chain lines 175 in FIG. 4B. Such a structure is not excluded from the present invention.

Since the optical member assembly 180 is formed from a translucent material mixed with a light-scattering material, the optical members 170 have light-scattering functions. Accordingly, light that enters the inside of the optical member assembly 180 tends to undergo light mixing. The light-scattering material is for example particles formed from a translucent material, and is dispersed in the translucent material. The particles are mixture of nano particles formed from a translucent material having a high heat conductivity and micro particles formed from a translucent material having a high heat conductivity. The nano particles have an average particle size that is equal to or less than the wavelength of blue light of 450 nm. The micro particles have an average particle size of 1 μm to 100 μm that is greater than the wavelength of red light of 660 nm. In the case where the visible light wavelength has a wavelength region of 450 nm to 750 nm, the nano particles have an average particle size smaller than the visible light wavelength, and the micro particles have an average particle size larger than the visible light wavelength. The nano particles and the micro particles are each formed from ZnO, MgO, sapphire, $Al_2O_3$, $Y_2O_3$, $TiO_2$, $ZrO_2$, or the like. The particles should preferably be formed from a material not having the wavelength conversion function. This is in order to avoid unnecessary wavelength conversion of light emitted from the light emitting elements 120W, 120R, and 120G, thereby to easily adjust color of light emitted from the light emitting module 100.

The above description has been given on the effects exhibited by the optical members, mainly with use of the optical members 170 which are each interposed between adjacent first light emitting part 101W and second light emitting part 101R. The same effects are also exhibited by the optical members 170 which are each interposed between adjacent second light emitting part 101R and third light emitting part 101G, and the optical members 170 which are each interposed between adjacent third light emitting part 101G and first light emitting part 101W. In the present embodiment, the optical members 170 are each interposed between adjacent first light emitting part 101W and second light emitting part 101R (between each two pairs), between adjacent second light emitting part 101R and third light emitting part 101G (between each two pairs), or between adjacent third light emitting part 101G and first light emitting part 101W (between one pair). Note that the light emitting module relating to the present invention is not limited to this structure. Alternatively, at least one optical member 170 only needs to be interposed between any adjacent light emitting parts 101W, 101R, and 101G.

[Modifications]

The following describes modifications of the light emitting module, the lighting apparatus, and the lighting fixture relating to the present invention. Note that materials that are the same as those already described have the same reference signs as those already described, and accordingly description thereof is simplified or omitted.

<Light Emitting Module>

The light emitting module relating to the present invention is not limited to the light emitting module 100 relating to the above embodiment. The following describes modifications of the light emitting module relating to the present invention.

(Modification 1)

Figure 8A:
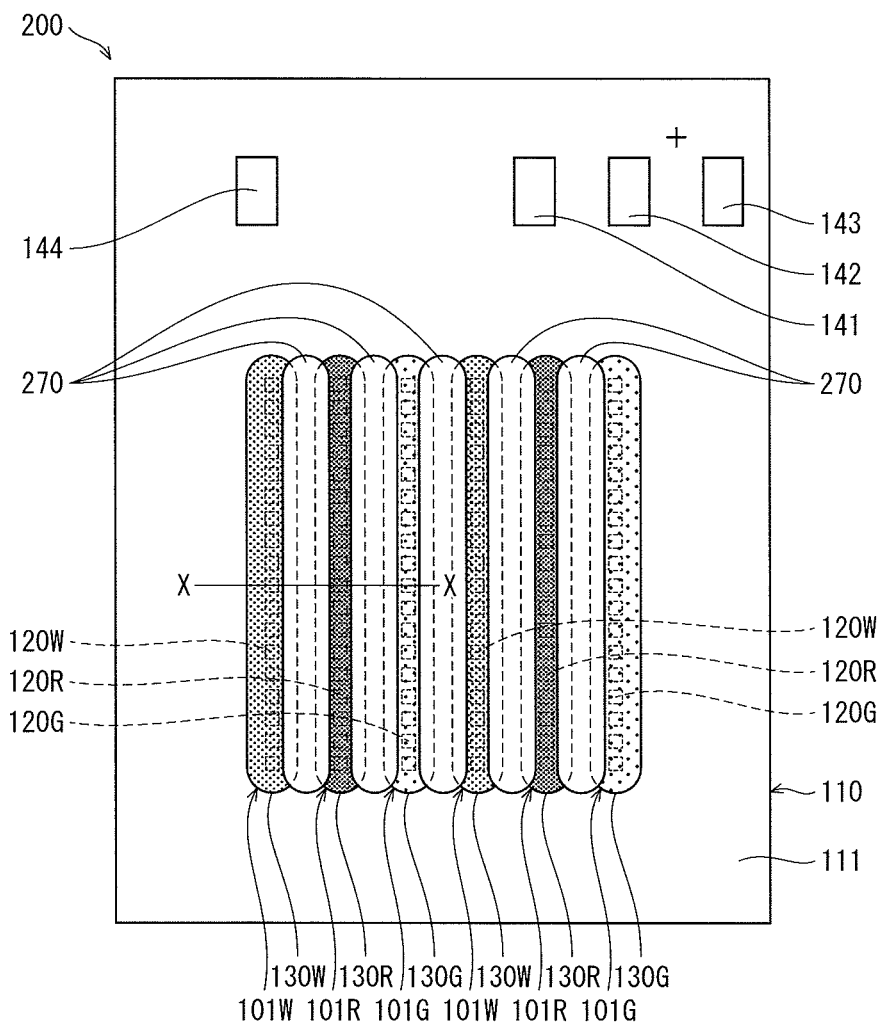
FIG. 8A is a plan view showing a light emitting module relating to Modification 1.
Figure 8B:
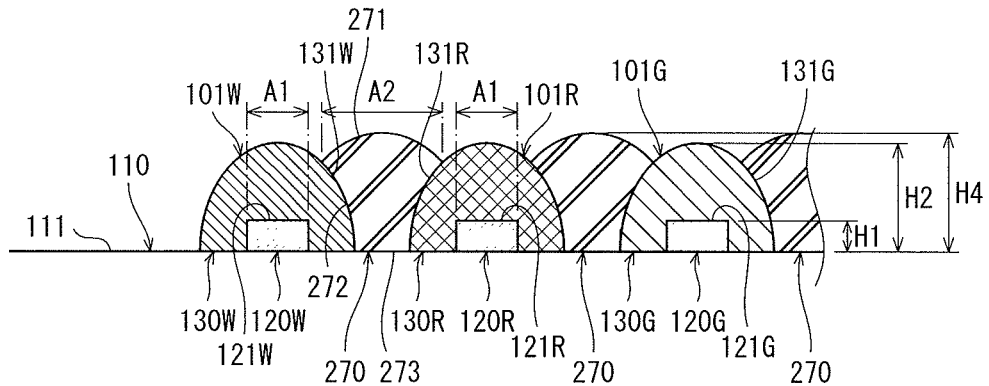
FIG. 8B is a cross-sectional view showing the light emitting module taken along a line X-X in FIG. 8A.

FIG. 8A is a plan view showing a light emitting module relating to Modification 1, and FIG. 8B is a cross-sectional view showing the light emitting module taken along a line X-X in FIG. 8A. Note that light emitting parts 101W, 101R, and 101G are represented by different types of hatching for each luminescent color in FIG. 8A such that luminescent colors are distinguishable. As shown in FIG. 8A, a light emitting module 200 relating to Modification 1 has the structure in which an independent optical member 270 is interposed between each adjacent light emitting parts 101W, 101R, and 101G. Note that a substrate 110, light emitting elements 120W, 120R, and 120G, sealing members 130W, 130R, and 130G, and terminal parts 141 to 144 are the same as those in the above embodiment.

The optical members 270 are each for example an elongated member that is formed along the longitudinal direction of the sealing members 130W, 130R, and 130G. The optical members 270 are each substantially equal to the sealing members 130W, 130R, and 130G in terms of longitudinal length. As shown in FIG. 8B, the optical members 270 each have an upper surface 271 that is curved. The optical members 270 each have an arc cross section cut along a virtual plane perpendicular to the longitudinal direction of the sealing members 130W, 130R, and 130G, where the upper surface 271 expands toward the side opposite to the substrate 110. The optical members 270 has a height H4 (maximum height) that is greater than a height H2 (maximum height) of the sealing members 130W, 130R, and 130G, and for example has a height H4 of 1.1 mm. The optical members 270 each have a side surface 272 that is in surface contact with any of respective surfaces 131W, 131R, and 131G of the sealing members 130W, 130R, and 130G with no gap therebetween, and each have a lower surface 273 that is in surface contact with the upper surface 111 of the substrate 110 with no gap therebetween. The optical members 270 having such a shape is formed by, for example, after formation of the light emitting parts 101W, 101R, and 101G, filling a gap between any adjacent light emitting parts 101W, 101R, and 101G with a translucent material in paste form so as to be elongated. Since the optical member 270 is formed in only a necessary part between adjacent light emitting parts 101W, 101R, and 101G, it is possible to reduce material costs for forming the optical member 270.

As described above, the optical members 270 may be independently formed at intervals. Also, the optical members 270 each may be formed only between adjacent light emitting parts 101W, 101R, and 101G. Furthermore, the optical members 270 may each have the height H4 that is greater than the height H2 of the sealing members 130W, 130R, and 130G.

(Modification 2)

Figure 9A:
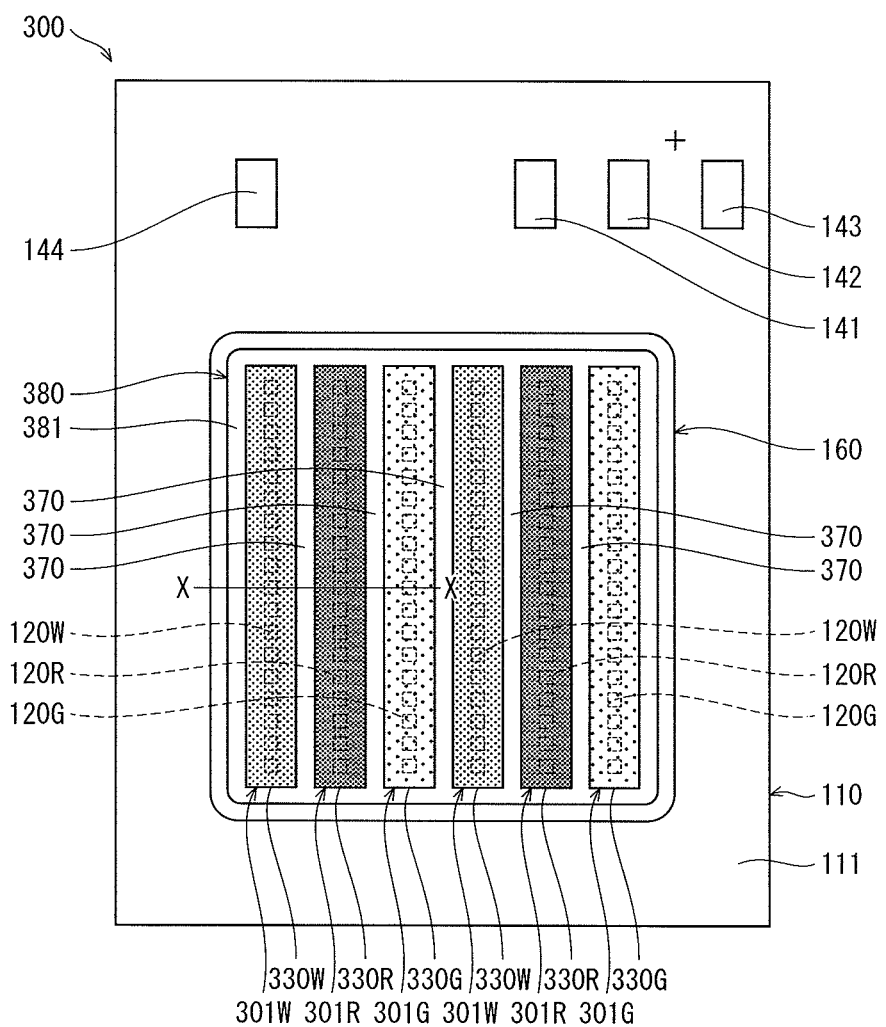
FIG. 9A is a plan view showing a light emitting module relating to Modification 2.
Figure 9B:
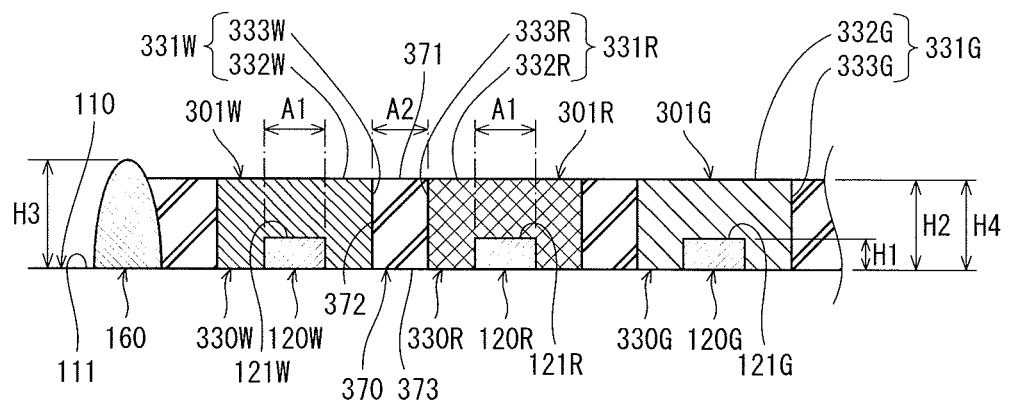
FIG. 9B is a cross-sectional view showing the light emitting module taken along a line X-X in FIG. 9A.

FIG. 9A is a plan view showing a light emitting module relating to Modification 2, and FIG. 9B is a cross-sectional view showing the light emitting module taken along a line X-X in FIG. 9A. Note that light emitting parts 301W, 301R, and 301G are represented by different types of hatching for each luminescent color in FIG. 9A such that luminescent colors are distinguishable. As shown in FIG. 9B, a light emitting module 300 relating to Modification 2 has the structure in which respective upper surfaces 332W, 332R, and 332G of sealing members 330W, 330R, and 330G and respective upper surfaces 371 of optical members 370 are all flat and flush with each other. Note that a substrate 110, light emitting elements 120W, 120R, and 120G, terminal parts 141 to 144, and a frame 160 shown in FIG. 9A are the same as those in the above embodiment.

The light emitting parts 330W, 330R, and 330G are each rectangular and elongated, and are arranged in parallel at regular intervals such that respective ends of the light emitting parts 330W, 330R, and 330G are aligned with each other. Also, as shown in FIG. 9B, the sealing members 330W, 330R, and 330G each have a height H2 of 1.0 mm for example, and have a rectangular cross section cut along a virtual plane perpendicular to the longitudinal direction of the sealing members 330W, 330R, and 330G.

As shown in FIG. 9A, an optical member assembly 380 is composed of five optical members 370 and a connecting member 381. The optical members 370 are each elongated, and are interposed between any adjacent light emitting parts 301W, 301R, and 301G. The connecting member 381 is substantially rectangularly annular, and surrounds all the optical members 370 and all the light emitting parts 301W, 301R, and 301G. Specifically, the optical members 370 are each for example an elongated member that is formed along the longitudinal direction of the sealing members 330W, 330R, and 330G, and are each substantially equal to the sealing members 330W, 330R, and 330G in terms of longitudinal length. As shown in FIG. 9B, the optical members 370 each have a height H4 that is equal to a height H2 of the sealing members 330W, 330R, and 330G, and have a height H4 of 1.0 mm for example. The optical members 370 each have an upper surface 371 that is flat, and the sealing members 330W, 330R, and 330G have respective upper surfaces 332W, 332R, and 332G that are flat. Accordingly, the respective upper surfaces 371 of the optical members 370 and the respective upper surfaces 332W, 332R, and 332G of the sealing members 330W, 330R, and 330G are flush with each other. The optical members 370 each have a side surface 372 that is in surface contact with any of respective side surfaces 333W, 333R, and 333G of the sealing members 330W, 330R, and 330G with no gap therebetween. Note that the respective surfaces 331W, 331R, and 331G of the sealing members 330W, 330R, and 330G are respectively constituted from the upper surface 332W and the side surface 333W, the upper surface 332R and the side surface 333R, and the upper surface 332G and the side surface 333G. The optical members 270 each have a lower surface 373 that is in surface contact with the upper surface 111 of the substrate 110 with no gap therebetween.

As described above, the optical members 370 each may be equal to the sealing members 330W, 330R, and 330G in terms of height. Also, the respective upper surfaces 371 of the optical members 370 and the respective upper surfaces 332W, 332R, and 332G of the sealing members 330W, 330R, and 330G may be each flat. Furthermore, the respective upper surfaces 371 of the optical members 370 and the respective upper surfaces 332W, 332R, and 332G of the sealing members 330W, 330R, and 330G may be flush with each other.

With the structure relating to the present modification, the respective upper surfaces 332W, 332R, and 332G of the sealing members 330W, 330R, and 330G are out of contact with the optical members 370. Accordingly, main light emitted directly upward from the light emitting parts 301W, 301R, and 301G does not undergo attenuation due to the optical members 170. This exhibits a high light extraction efficiency of the light emitting elements 120W, 120R, and 120G.

(Modification 3)

Figure 10:
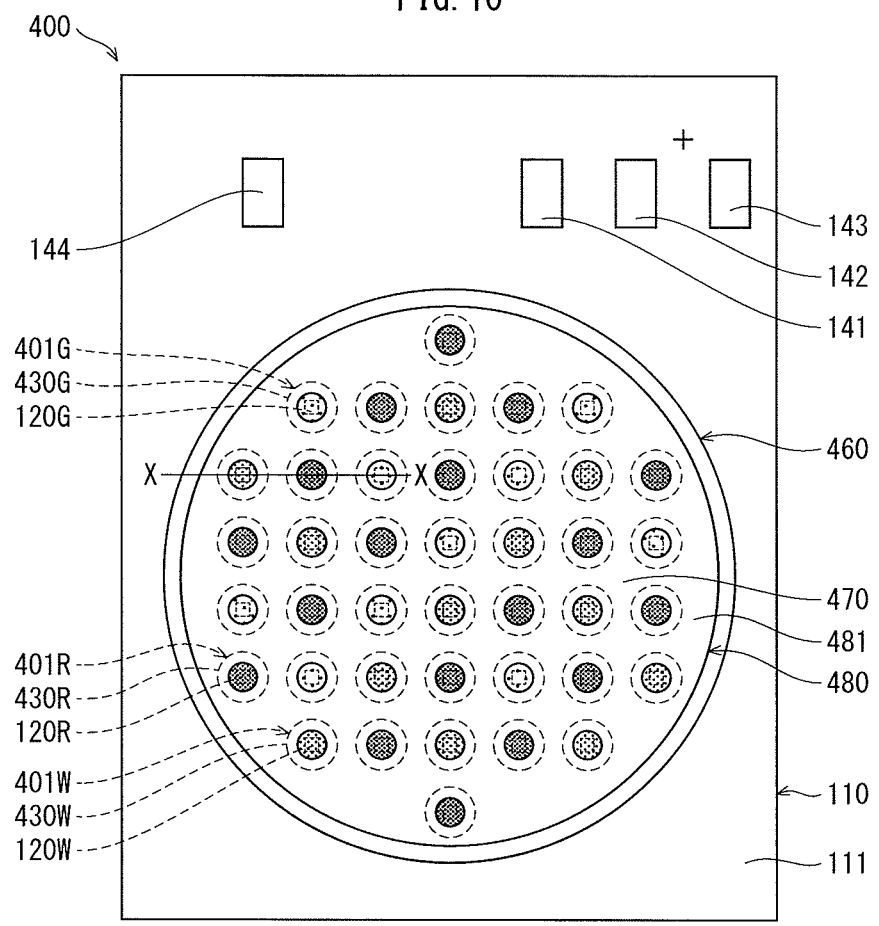
FIG. 10 is a plan view showing a light emitting module relating to Modification 3.

FIG. 10 is a plan view showing a light emitting module relating to Modification 3. A cross-sectional view showing the light emitting module taken along a line X-X in FIG. 10 is the same as that shown in FIG. 4B, and accordingly is omitted here. Note that light emitting parts 401W, 401R, and 401G are represented by different types of hatching for each luminescent color in FIG. 10 such that luminescent colors are distinguishable. As shown in FIG. 10, a light emitting module 400 relating to Modification 3 has the structure in which the light emitting parts 401W, 401R, and 401G each do not have an elongated shape unlike in the above embodiment, and have a dot shape. Note that a substrate 110, light emitting elements 120W, 120R, and 120G, and terminal parts 141 to 144 are the same as those in the above embodiment.

The substrate 110 has provided, on an upper surface 111 thereof, the first light emitting parts 401W that emit white light, the second light emitting parts 401R that emit red light, and the third light emitting parts 101G that emit green light at intervals. The light emitting parts 401W, 401R, and 401G are each substantially a semi-elliptical sphere formed by flattening an elliptical sphere so as to increase in diameter upward and downward and dividing the elliptical sphere in half up and down to leave only the upper half. The sealing members 430W, 430R, and 430G have the same shape as the light emitting parts 401W, 401R, and 401G. The first light emitting parts 401W are each composed of one first light emitting element 120W and one first sealing member 430W that seals the first light emitting element 120W. The second light emitting parts 401R are each composed of one second light emitting element 120R and one second sealing member 430R that seals the second light emitting element 120R. The third light emitting parts 401G are each composed of one third light emitting element 120G and one third sealing member 430G that seals the third light emitting element 120G.

A frame 460 is for example substantially circularly annular, and is provided on the upper surface 111 of the substrate 110 so as to surround the light emitting parts 401W, 401R, and 401G.

An optical member assembly 480 is composed of one optical member 470 and a connecting member 481. The optical member 470 is provided so as to be interposed between each adjacent light emitting parts 401W, 401R, and 401G. The connecting member 481 that is annular, and surrounds the optical member 470 and all the light emitting parts 401W, 401R, and 401G. Specifically, the optical member 170 is provided so as to be interposed between each adjacent light emitting parts 401W, 401R, and 401G in the horizontal, vertical, and diagonal directions, that is, between each adjacent first light emitting part 401W and second light emitting part 401R, between each adjacent second light emitting part 401R and third light emitting part 401G, and between each adjacent first light emitting part 401W and third light emitting part 401G.

As described above, the light emitting parts 401W, 401R, and 401G may be provided in a dot pattern. The number of light emitting elements 120W, 120R, and 120G respectively to be sealed by the sealing members 430W, 430R, and 430G each may be not plural but one. In this way, the light emitting parts 401W, 401R, and 401G are each reduced in size and increased in number. As a result, light emitted from the light emitting parts 401W, 401R, and 401G is easy to uniformly mix with each other, and therefore color unevenness of illumination light is difficult to occur.

(Modification 4)

Figure 11A:
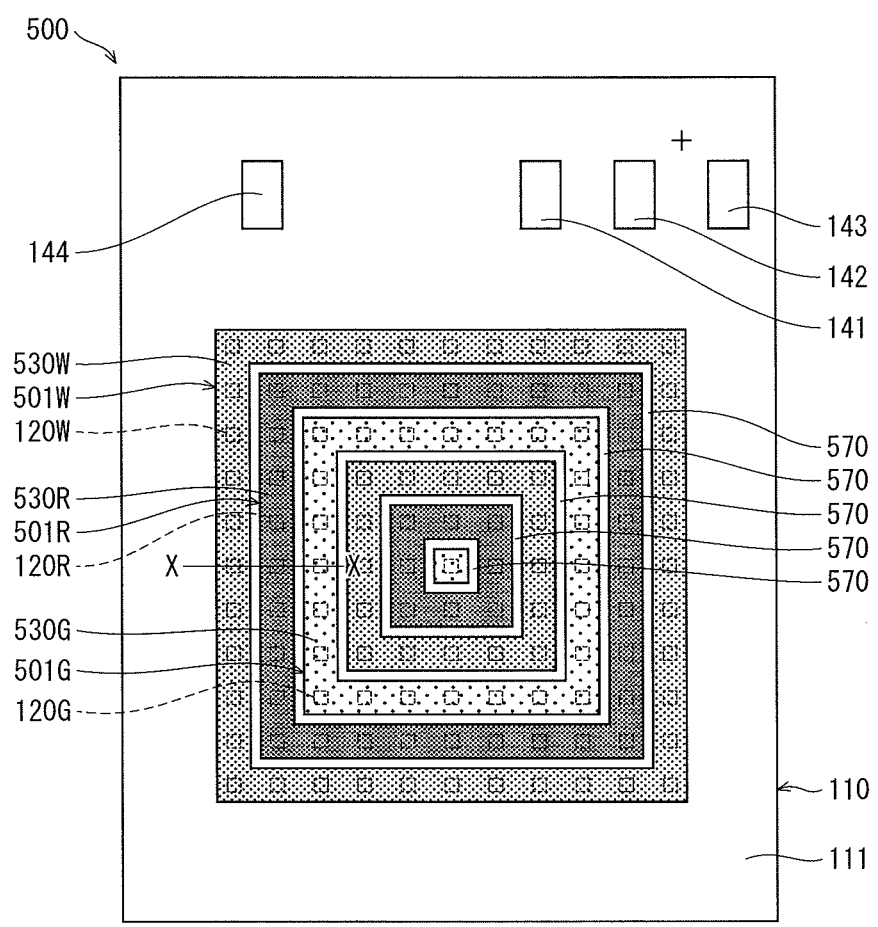
FIG. 11A is a plan view showing a light emitting module relating to Modification 4.

FIG. 11A is a plan view showing a light emitting module relating to

Figure 11B:
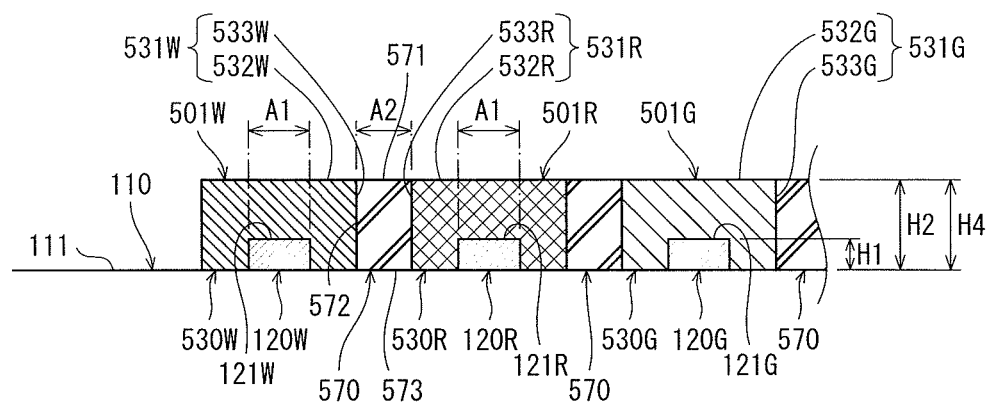
FIG. 11B is a cross-sectional view showing the light emitting module taken along a line X-X in FIG. 11A.

Modification 4, and FIG. 11B is a cross-sectional view showing the light emitting module taken along a line X-X in FIG. 11A. Note that light emitting parts 501W, 501R, and 501G are represented by different types of hatching for each luminescent color in FIG. 11A such that luminescent colors are distinguishable. As shown in FIG. 11A, a light emitting module 500 relating to Modification 4 has the structure in which the light emitting parts 501W, 501R, and 501G are each rectangularly annular, and are arranged so as to have the same annular axis. The light emitting parts 501W are each composed of a plurality of light emitting elements 120W that are annularly arranged and one sealing member 530W that is rectangularly annular and seals the light emitting elements 120W. The light emitting parts 501R are each composed of a plurality of light emitting elements 120R that are annularly arranged and one sealing member 530R that is rectangularly annular and seals the light emitting elements 120R. The light emitting parts 501G are each composed of a plurality of light emitting elements 120G that are annularly arranged and one sealing member 530G that is rectangularly annular and seals the light emitting elements 120G. A plurality of optical members 570 that are each rectangularly annular are each interposed between any adjacent light emitting parts 501W, 501R, and 501G. Note that a substrate 110, light emitting elements 120W, 120R, and 120G, and terminal parts 141 to 144 are the same as those in the above embodiment.

The optical members 570 each have a height H4 that is equal to a height H2 of the sealing members 530W, 530R, and 530G, and have a height H4 of 1.0 mm for example. The optical members 570 each have an upper surface 571 that is flat, and the sealing members 530W, 530R, and 530G have respective upper surfaces 532W, 532R, and 532G that are flat. Accordingly, the respective upper surfaces 571 of the optical members 570 and the respective upper surfaces 532W, 532R, and 532G of the sealing members 530W, 530R, and 530G are flush with each other. The optical members 570 each have a side surface 572 that is in surface contact with any of respective side surfaces 533W, 533R, and 533G of the sealing members 530W, 530R, and 530G with no gap therebetween. Note that the respective surfaces 531W, 531R, and 531G of the sealing members 530W, 530R, and 530G are respectively constituted from the upper surface 532W and the side surface 533W, the upper surface 532R and the side surface 533R, and the upper surface 532G and the side surface 533G. The optical members 570 each have a lower surface 573 that is in surface contact with the upper surface 111 of the substrate 110 with no gap therebetween.

As described above, the light emitting parts 501W, 501R, and 501G and the optical members 570 each may be annular. With the structure in which the light emitting parts 501W, 501R, and 501G and the optical members 570 are each annular, illumination light is emitted with no color unevenness in all directions at 360 degrees around the annular axis.

(Others)

The light emitting module 100 relating to the above embodiment includes LEDs as the light emitting elements 120W, 120R, and 120G. Alternatively, the light emitting elements relating to the present invention may be LDs (laser diodes), EL (electroluminescence) elements, or the like. Also, the light emitting elements relating to the present invention are not limited to light emitting elements that are face-up mounted with use of the COB technique. Alternatively, SMDs (Surface Mount Devices) for example may mounted on a substrate as the light emitting elements relating to the present invention.

Also, the light emitting module 100 relating to the above embodiment includes three types of light emitting modules, namely, the first light emitting parts 101W that emit white light, the second light emitting parts 101R that emit red light, and the third light emitting parts 101G that emit green light. However, the number of types of light emitting parts relating to the present invention is not limited to three, and only needs to be two or more. Also, two light emitting parts are provided for each type in the light emitting module 100. Alternatively, one or at least three light emitting parts may be provided for each type. Furthermore, it is unnecessary to provide the same number of light emitting parts for each type. Moreover, luminescent colors of each type of light emitting parts are not limited to white, red, and green colors. Alternatively, the luminescent colors each may be any color as long as the luminescent colors differ from each other.

Also, the light emitting module 100 relating to the above embodiment includes the light emitting parts 101W, 101R, and 101G respectively including 18 light emitting elements 120W, 120R, and 120G. The number of the light emitting elements relating to the present invention is not limited to 18, and may be arbitrary. Furthermore, it is unnecessary to provide the same number of light emitting elements for each light emitting part. Moreover, the light emitting elements relating to the present invention are not limited to light emitting elements that emit blue light having a peak wavelength of 450 nm to 470 nm. Alternatively, the light emitting elements relating to the present invention may be blue light emitting elements that emit blue light not having a peak wavelength of 450 nm to 470 nm, light emitting elements that emit visible light of a color other than blue color, or light emitting elements that emit ultraviolet light.

Also, the wavelength conversion materials relating to the present invention may be phosphors shown below depending on excitation light emitted from light emitting elements.

Suitable examples of blue phosphors include aluminate phosphors such as $BaMgAl_{10}O_{17}:Eu^{2+}$, halophosphate phosphors such as $(Sr,Ba)_{10}(PO_4)_6Cl_7:Eu^{2+}$ and $Sr_{10}(PO_4)_6Cl_2:Eu^{2+}$, or silicate phosphors such as $Ba_3MgSi_3O_8:Eu^{2+}$.

Suitable examples of blue-green phosphors include aluminate phosphors such as $Sr_4Al_{14}O_{25}:Eu2+$ and silicate phosphors such as $Sr_2Si_3O_8.2SrCl_2:Eu2+$.

Suitable examples of green phosphors include aluminate phosphors such as $BaMgAl_{10}O_{17}:Eu^{2+}$, $Mn^{2+}$, $(Ba,Sr,Ca)Al_2O_4:Eu^{2+}$, and $(Ba,Sr)_2SiO_4:Eu^{2+}$, α-sialon phosphors such as $Sr_{1.5}Al_3Si_9N_{16}:Eu^{2+}$ and Ca-α-SiAlON:$Yb^{2+}$, β-sialon phosphors such as β-$Si_3N_4:Eu^{2+}$, oxynitride phosphors such as $Ba_3Si_6O_{12}N_2:Eu^{2+}$, oxo-nitridosilicates such as (Ba, Sr, Ca)$Si_2O_2N_2:Eu^{2+}$, oxo-nitridoaluminosilicates such as $(Ba,Sr,Ca)_2Si_4AlON_7:Ce^{3+}$ and $(Ba,Sr,Ca)Al_{2-x}Si_xO_{4-x}N_x:Eu^{2+}$ (0<x<2), nitridosilicate which is a type of nitridosilicate phosphors such as $(Ba,Sr,Ca)_2Si_5N_8:Ce^{3+}$, thiogallate which is a type of sulfide phosphors such as $SrGa_2S_4:Eu^{2+}$, and garnet phosphors such as $Ca_3Sc_2Si_3O_{12}:Ce^{3+}$, $BaY_2SiAl_4O_{12}:Ce^{3+}$, and $Y_3(Al,Ga)_5O_{12}:Ce^{3+}$, and oxide phosphors such as $CaSc_2O_4:Ce^{3+}$.

Suitable examples of yellow phosphors include silicate phosphor such as $(Sr,Ba)_2SiO_4:Eu^{2+}$ and $Sr_3SiO_5:Eu^{2+}$, garnet phosphors such as $(Y,Gd)_3Al_5O_{12}:Ce^{3+}$, $Y_3Al_5O_{12}:Ce^{3+}$, $Y_3Al_5O_{12}:Ce^{3+}$, $Pr^{3+}$, and $Tb_3Al_5O_{12}:Ce^{3+}$, thiogallate phosphor which is a type of sulfide phosphors such as $CaGa_2S_4:$ $Eu^{2+}$, α-sialon phosphors such as Ca-α-SiAlON:$Eu^{2+}$, $(0.75(Ca_{0.9}Eu_{0.1})O.2.25AlN.3.25Si_3N_4:Eu^{2+}$, $Ca_{1.5}Al_3Si_9N_{16}:Eu^{2+}$ or the like), oxynitride phosphors such as $Ba_3Si_6O_{12}N_2:Eu^{2+}$, and nitride phosphors such as $(Ca,Sr,Ba)AlSiN_3:Eu^{2+}$.

Suitable examples of orange phosphors include silicate phosphors such as $(Sr,Ca)_2SiO_4:Eu^{2+}$, garnet phosphors such as $Gd_3Al_5O^{12}:Ce^{3+}$, and α-sialon phosphors such as Ca-α-SiAlON:$Eu^{2+}$.

Suitable examples of red phosphors include thiogallate which is a type of sulfide phosphors, such as $(Sr,Ca)S:Eu^{2+}$ and $La_2O_2S:Eu^{3+}$, $Sm^{3+}$, silicate phosphors such as $Ba_3MgSi_2O_8:Eu^{2+}:Mn^{2+}$, nitride phosphors such as $CaAlSiN_3:Eu^{2+}$, $(Ca,Sr)SiN_2:Eu^{2+}$, and $(Ca,Sr)AlSiN_3:Eu^{2+}$, and oxynitride phosphors such as $Sr_2Si_{5-x}Al_xO_xN_{8-x}:Eu^{2+}$ (0≤x≤1) and $Sr_2(Si,Al)_5(N,O)_8:Eu^{2+}$.

<Lighting Apparatus>

The lighting apparatus relating to the present invention is not limited to the lighting apparatus 10 relating to the above embodiment. For example, in the above embodiment, the lighting apparatus relating to the present invention is applied to a lamp unit for a downlight. However, an embodiment of the lighting apparatus relating to the present invention is not limited to the above embodiment. For example, the lighting apparatus relating to the present invention may be applied to a straight-tube LED lamp and an LED bulb described below that are expected as alternative to straight-tube fluorescent lamps. The straight-tube LED lamp is an LED lamp that has substantially the same shape as a conventional general straight-tube fluorescent lamp using electrode coils. The LED bulb is an LED lamp that has substantially the same shape as a conventional incandescent lamp.

(Modification 5)

Figure 12:
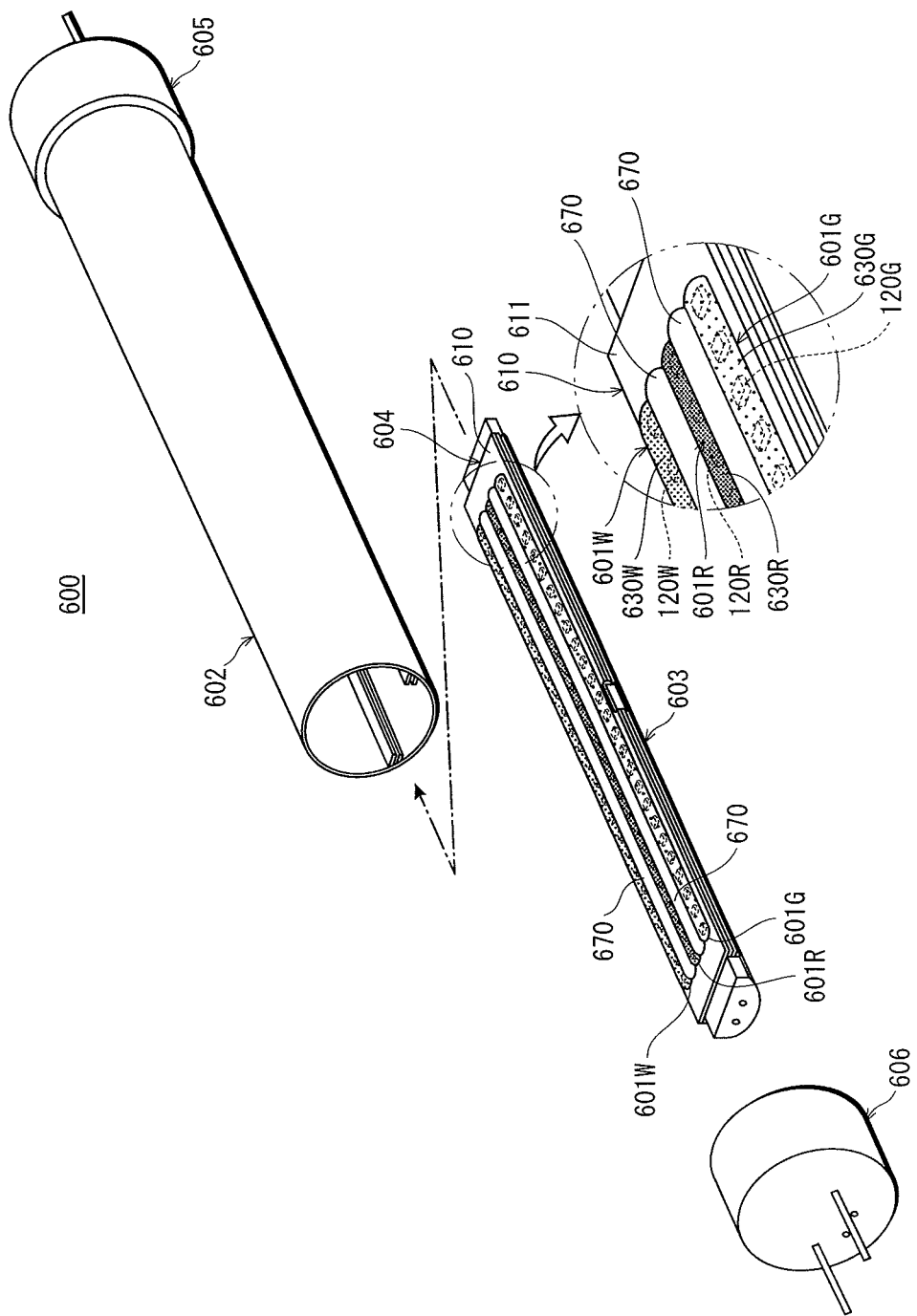
FIG. 12 is a perspective view showing a lighting apparatus relating to Modification 5.

FIG. 12 is a perspective view showing a lighting apparatus relating to Modification 5. Note that light emitting parts 601W, 601R, and 601G are represented by different types of hatching for each luminescent color in FIG. 12 such that luminescent colors are distinguishable. As shown in FIG. 12, a lighting apparatus 600 relating to Modification 5 includes a housing 602 that is elongated and tubular, a mount 603 that is disposed in the housing 602, a light emitting module 604 that is mounted on the mount 603, and a pair of bases 605 and 606 that are attached to respective ends of the housing 602.

The housing 602, which is elongated and tubular, has an opening at each of the ends thereof, and houses therein the mount 603 and the light emitting module 604. Although materials of the housing 602 are not particularly limited, a translucent material is preferable. The preferable translucent material is for example a resin such as a plastic, a glass, or the like. The shape of a cross section of the housing 602 is not particularly limited, and may be circularly annular or polygonally annular.

The mount 603 is elongated and plate-like, and has respective both ends extending to the vicinity of the pair of bases 605 and 606. The mount 603 is substantially equal to the housing 602 in terms of longitudinal length. The mount 603 should preferably function as a heat dissipation member (heat sink) for dissipating heat generated from the light emitting module 604, and accordingly should preferably be formed from a high heat conductive material such as a metal.

The light emitting module 604 includes a substrate 610, a first light emitting part 601W, a second light emitting part 601R, and a third light emitting part 601G that are provided on an upper surface 611 of the substrate 610 at intervals. The light emitting parts 601W, 601R, and 601G respectively have substantially the same structure of the light emitting parts 101W, 101R, and 101G relating to the above embodiment. The light emitting part 601W includes a plurality of light emitting elements 120W that are linearly arranged and one sealing member 630W that is elongated and seals the light emitting elements 120W. The light emitting part 601R includes a plurality of light emitting elements 120R that are linearly arranged and one sealing member 630R that is elongated and seals the light emitting elements 120R. The light emitting part 601G includes a plurality of light emitting elements 120G that are linearly arranged and one sealing member 630G that is elongated and seals the light emitting elements 120G. The sealing members 630W, 630R, and 630G respectively have substantially the same structure of the sealing members 130W, 130R, and 130G relating to the above embodiment. Optical members 670 are each interposed between any adjacent light emitting parts 101W, 101R, and 101G, and have substantially the same structure as the optical members 270 relating to Modification 1.

The pair of bases 605 and 606 are each attached to a socket of a lighting fixture (not illustrated). While the lighting apparatus 600 is attached to the lighting fixture, an electric power is fed to the light emitting module 604 via the pair of bases 605 and 606. Also, heat generated from the light emitting module 604 is conducted to the lighting fixture via the mount 603 and the pair of bases 605 and 606.

(Modification 6)

Figure 13:
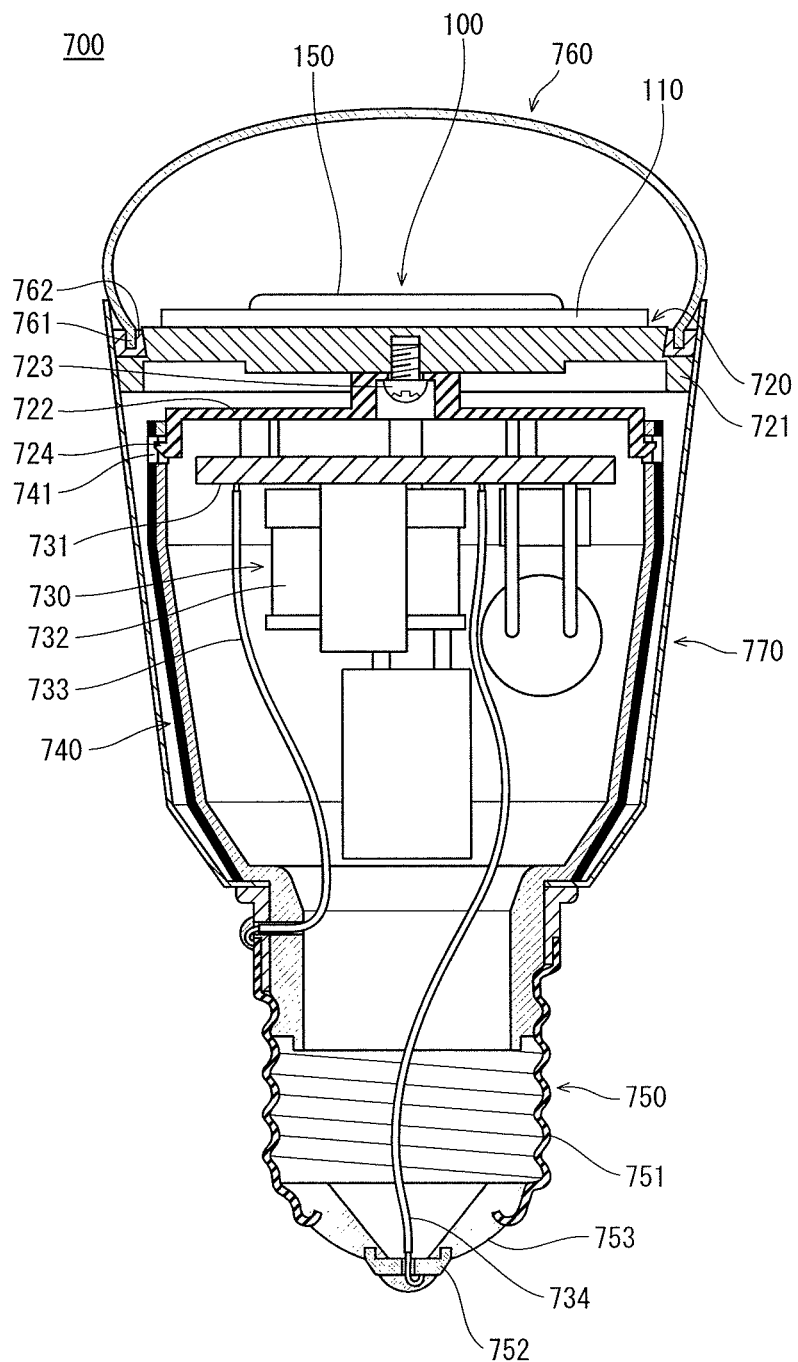
FIG. 13 is a cross-sectional view showing a lighting apparatus relating to Modification 6.

FIG. 13 is a cross-sectional view showing a lighting apparatus relating to Modification 6. As shown in FIG. 13, a lighting apparatus 700 relating to Modification 6 is an LED bulb, and mainly includes a light emitting module 100, a holder 720, a circuit unit 730, a circuit case 740, a base 750, a globe 760, and a housing 770.

The light emitting module 100 is the same as the light emitting module 100 relating to the above embodiment.

The holder 720 includes a module holding part 721 and a circuit holding part 722. The module holding part 721 is a member for attaching the light emitting module 100 to the housing 770, and is substantially discoid and plate-like. The module holding part 721 is formed from a high heat conductive material such as an aluminum, and accordingly functions as a heat conducting member for conducting heat generated from the light emitting module 100 to the housing 770 owing to its material properties. The circuit holding part 722 is for example substantially circular and dish-shaped, and is formed from a synthetic resin. The circuit holding part 722 is fixed to the module holding part 721 by a screw 723. The circuit holding part 722 has, at an outer periphery thereof, an engaging claw 724 that is to be engaged with the circuit case 740.

The circuit unit 730 includes a circuit substrate 731 and a plurality of electronic components 732 that are mounted on the circuit substrate 731. The circuit unit 730 is housed in the housing 770 while the circuit substrate 731 is fixed to the circuit holding part 722. The circuit unit 730 is electrically connected with the light emitting module 100. The circuit unit 730 corresponds to the circuit unit 4 relating to the above embodiment.

The circuit case 740 is attached to the circuit holding part 722 while the circuit unit 730 is housed in the circuit case 740. The circuit case 740 has an engaging hole 741 that is to be engaged with the engaging claw 724 of the circuit holding part 722. The circuit case 740 is attached to the circuit holding part 722 by engaging the engaging claw 724 with the engaging hole 741.

The base 750 is a base defined by JIS (Japanese Industrial Standard) such as a base compliant with the standards of the E-type base, and is used for attachment to a socket (not illustrated) for general incandescent lamps. The base 750 includes a shell 751 that is referred to also as a cylindrical barrel and an eyelet 752 that is circular and dish-shaped. The base 750 is attached to the circuit case 740. The shell 751 and the eyelet 752 are integrally formed with an insulating part 753 therebetween that is formed from a glass material. The shell 751 and the eyelet 752 are electrically connected with a feed wire 733 and a feed wire 734 of the circuit unit 730, respectively.

The globe 760 is substantially dome-shaped, and has an opening edge 761 that is fixed to the housing 770 and the module holding part 721 with use of an adhesive 762 such that the globe 760 covers the light emitting module 100.

The housing 770 is for example cylindrical. The light emitting module 100 is disposed at a side of one of openings of the housing 770, and the base 750 is disposed at a side of the other opening of the housing 770. The housing 770 is formed from, as a base material, a high heat conductive material such as an aluminum so as to function as a heat sink for dissipating heat generated from the light emitting module 100.

(Modification 7)

Figure 14:
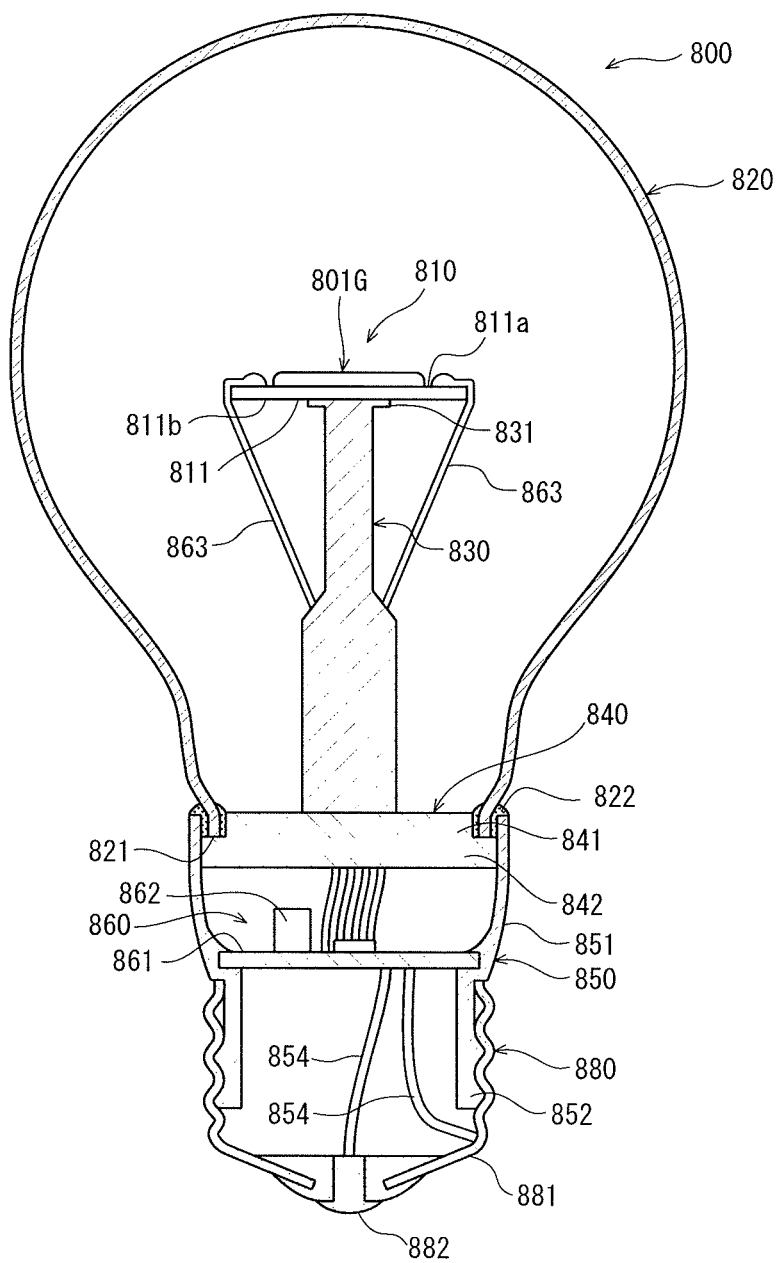
FIG. 14 is a cross-sectional view showing a lighting apparatus relating to Modification 7.
Figure 15:
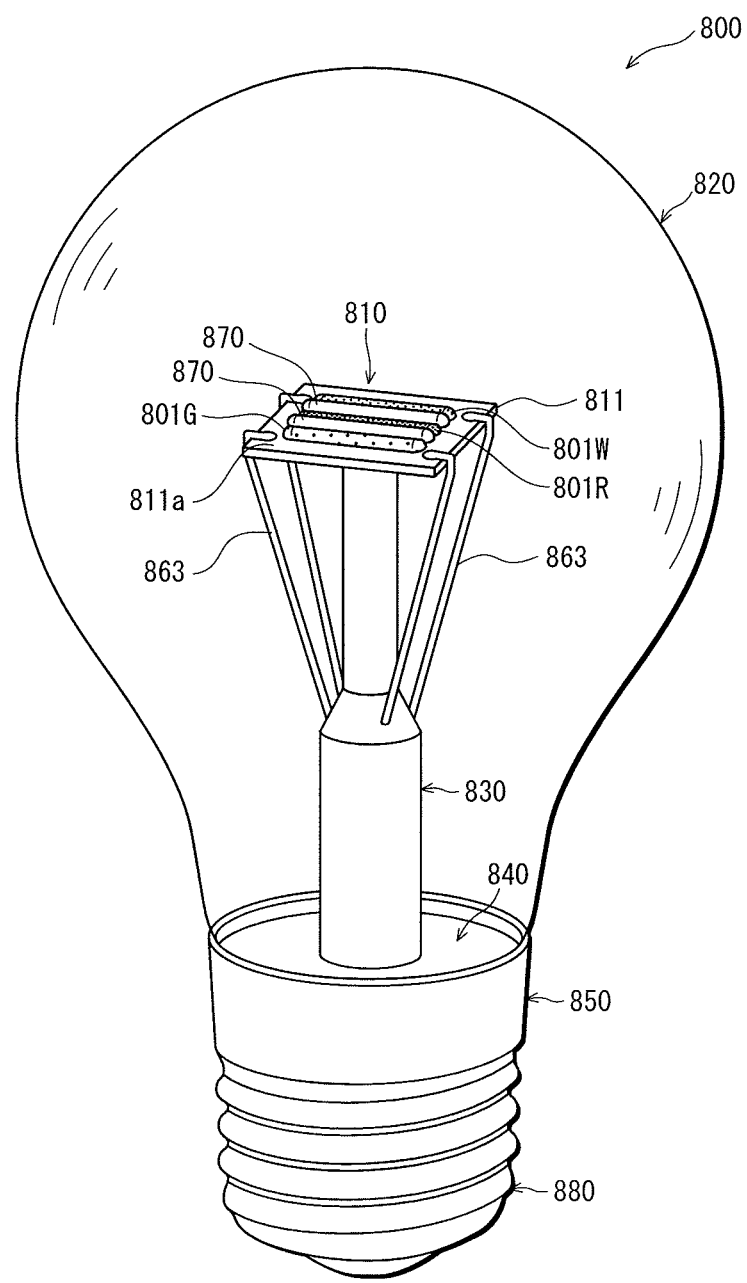
FIG. 15 is a perspective view showing the lighting apparatus relating to Modification 7.

FIG. 14 is a cross-sectional view showing a lighting apparatus relating to Modification 7. FIG. 15 is a perspective view showing the lighting apparatus relating to Modification 7. Note that light emitting parts 801W, 801R, and 801G are represented by different types of hatching for each luminescent color in FIG. 15 such that luminescent colors are distinguishable. As shown in FIG. 14, a lighting apparatus 800 relating to Modification 7 is an LED bulb, and mainly includes a light emitting module 810, a globe 820, a stem 830, a supporting member 840, a case 850, a circuit unit 860, and a base 880.

As shown in FIG. 15, the light emitting module 810 includes a substrate 811, and a first light emitting part 801W, a second light emitting part 801R, and a third light emitting part 801G that are provided on a upper surface 811a of the substrate 811. The substrate 811 is a translucent substrate formed from a translucent material. The light emitting parts 801W, 801R, and 801G are for example each elongated. Both ends of each of the light emitting parts 801W, 801R, and 801G in the longitudinal direction thereof are each round (specifically, substantially quarter-spherical), and also are each semicircular in plan view. Also, the light emitting parts 801W, 801R, and 801G each have substantially a semi-elliptical cross section cut along a virtual plane perpendicular to the longitudinal direction. The light emitting parts 801W, 801R, and 801G each include a plurality of light emitting elements that are linearly arranged (not illustrated) and one sealing member that is elongated (no reference sign is appended because of being in the same position as the light emitting parts 801W, 801R, and 801G in FIG. 15). The light emitting parts 801W, 801R, and 801G respectively have substantially the same structure of the light emitting parts 101W, 101R, and 101G relating to the above embodiment. A plurality of optical members 870 are each interposed between any adjacent light emitting parts 801W, 801R, and 801G, and have substantially the same structure as the optical members 270 relating to Modification 1.

The globe 820 has the same shape as a glass bulb for general incandescent lamps, and houses therein the light emitting module 810. The globe 820 is formed from a translucent material such as a silica glass and an acrylic resin. The light emitting module 810, which is housed in the globe 820, is externally visible because of the globe 820 being transparent. Since the light emitting module 810 is disposed on substantially the central part inside the globe 820, the lighting apparatus 800 has light distribution properties similar to incandescent lamps. Furthermore, since the substrate 811 is a translucent substrate, light that is emitted from the light emitting parts 801W, 801R, and 801G provided on the upper surface 811a of the substrate 811 transmits through the substrate 811, and as a result the side of the base 880 is illuminated with the light, in addition to the light emission side. Accordingly, the lighting apparatus 800 has light distribution properties further similar to incandescent lamps. Note that the globe 820 does not necessarily need to be transparent. Alternatively, the globe 820 may be for example a semi-transparent globe whose inner surface is an opaque white diffusion film formed from a silica. Furthermore, the light emitting parts 801W, 801R, and 801G may be provided on a lower surface 811b of the substrate 811 shown in FIG. 14, in addition to on the upper surface 811a.

The stem 830 is rod, and is disposed so as to extend from the vicinity of an opening 821 of the globe 820 toward the inside of the globe 820. The stem 830 has a base end that is fixed to the supporting member 840 and a front end on which the light emitting module 810 is attached. The stem 830 should preferably be formed from a material having a heat conductivity higher than the substrate 811 of the light emitting module 810 so as to conduct heat generated from the light emitting module to the supporting member 840. The stem 830 should preferably be for example formed from a metal material such as an aluminum and an aluminum alloy or an inorganic material such as a ceramic. The light emitting module 810 is attached to the stem 830 by adhering the substrate 811 on which the light emitting module 810 is mounted to a mounting part 831 provided on the front end of the stem 830, with use of an adhesive material such as an adhesive and an adhesive sheet. One example of the adhesive is a high heat conductive adhesive formed by dispersing metal fine particles in a silicone resin. One example of the adhesive sheet is a high heat conductive adhesive sheet formed by dispersing a heat conductive filler such as an alumina, a silica, and a titanium oxide in an epoxy resin to be in a sheet form, and applying an adhesive to both surfaces of the sheet. The high heat conductive adhesive and adhesive sheet are suitable because of being capable of efficiently conducting heat generated from the light emitting module 810 to the stem 830. Note that mirror finishing may be performed on a surface of the stem 830 through polishing process to form a reflective surface such that light distribution control is performed.

The supporting member 840 is circular and plate-like, and includes a first supporting part 841 that is positioned at a side close to the light emitting module 810 and a second supporting part 842 that is positioned at a side close to the base 880. The first supporting part 841 is smaller in terms of diameter than the second supporting part 842, and this causes difference in level on an outer periphery of the supporting member 840. While the opening 821 of the globe 820 is in abutment with the difference in level, the globe 820 is adhered to the supporting member 840 with use of an adhesive 822. As a result, the opening 821 of the globe 820 is closed by the second supporting part 842. The supporting member 840 is formed from a high heat conductive material like the stem 830, such as a metal material and an inorganic material. Note that mirror finishing may be performed on a surface of the first supporting part 841 through polishing process to form a reflective surface such that light distribution control is performed.

The case 850 is a tubular member that houses therein the circuit unit 860, and is formed from an insulating material such as a polyethylene terephthalate (PBT) containing glass fibers. The case 850 includes a first case part 851 that is positioned at a side close to the globe 820 and a second case part 852 that is positioned at a side close to the base 880. While the first case part 851 is fit onto the supporting member 840, the supporting member 840 is fixed to the case 850 with use of the adhesive 822. The second case part 852 has a screw groove in an outer peripheral surface thereof, and the base 880 is screwed into the second case part 852 via the screw groove.

The circuit unit 860 is housed in the case 850, and includes a circuit substrate 861 and a plurality of electronic components 862 that are mounted on the circuit substrate 861. The circuit unit 860 corresponds to the circuit unit 4 relating to the above embodiment. The light emitting module 810 is electrically connected with the circuit unit 860 for example via feed wires 863 that are formed from a metal wire containing a high heat conductive copper (Cu). One end of each of the feed wires 863 is electrically connected with a terminal part (not illustrated) of the light emitting module 810 by soldering or the like, and the other end of the feed wire 863 is electrically connected with circuit unit 860.

The base 880 is a base defined by JIS such as a base compliant with the standards of the E-type base, and is used for attachment to a socket (not illustrated) for general incandescent lamps. The base 880 includes a shell 871 that is referred to also as a cylindrical barrel and an eyelet 872 that is circular and dish-shaped. The shell 871 and the eyelet 872 are each electrically connected with the circuit unit 860 via a feed wire 854.

(Modification 8)

Figure 16:
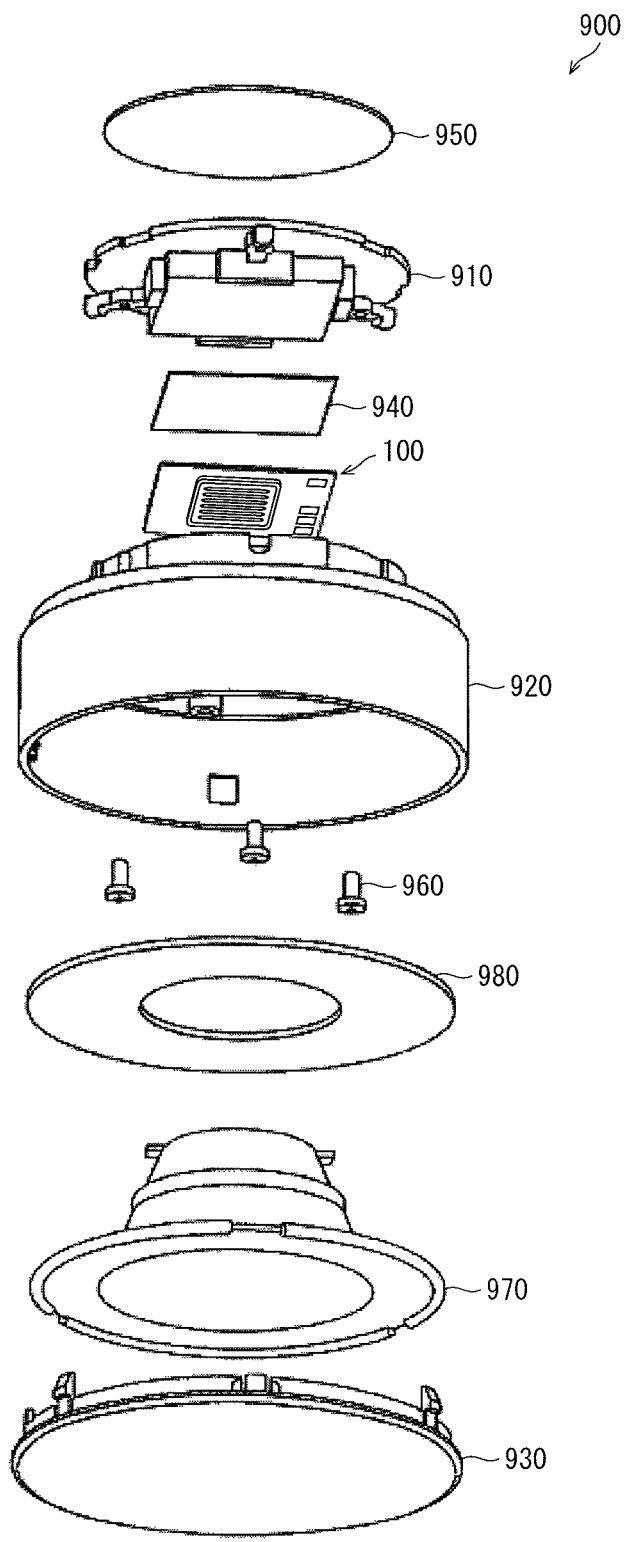
FIG. 16 is an exploded perspective view showing a lighting apparatus relating to Modification 8.
Figure 17:
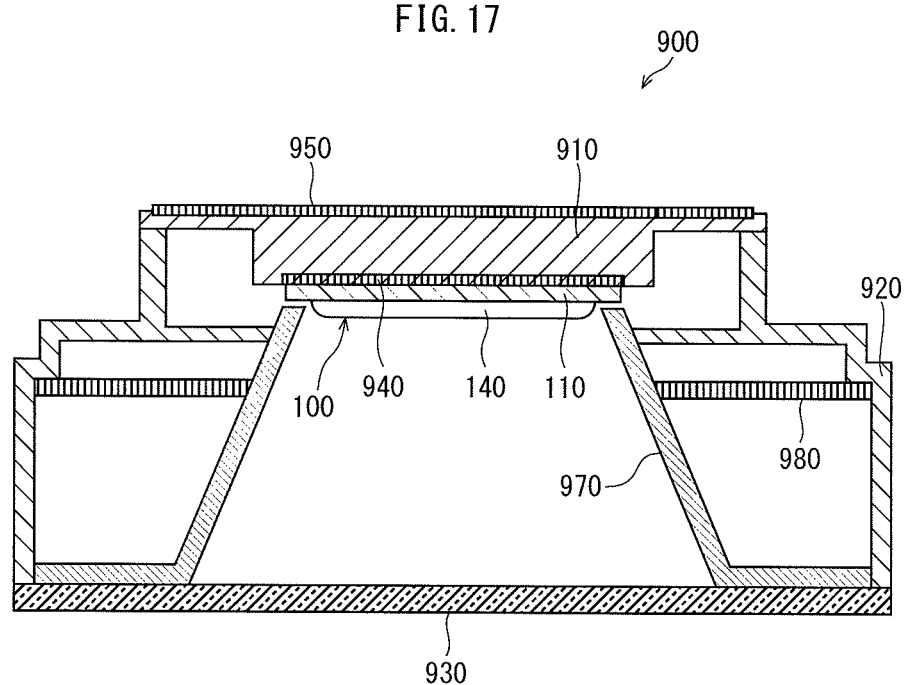
FIG. 17 is a cross-sectional view showing the lighting apparatus relating to Modification 8.
Figure 18:
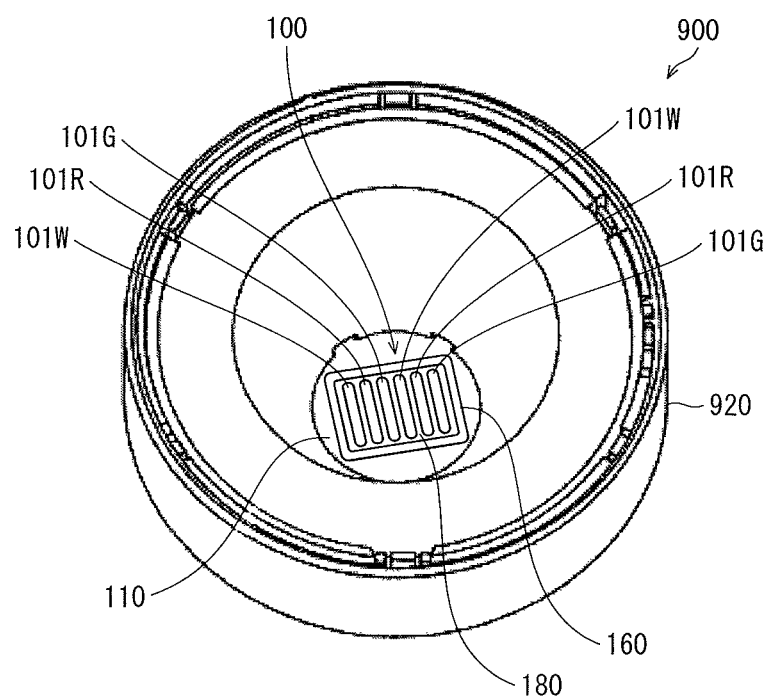
FIG. 18 is a perspective view showing the lighting apparatus relating to Modification 8.

FIG. 16 is an exploded perspective view showing a lighting apparatus relating to Modification 8. FIG. 17 is a cross-sectional view showing the lighting apparatus relating to Modification 8. FIG. 18 is a perspective view showing the lighting apparatus relating to Modification 8.

As shown in FIG. 16, a lighting apparatus 900 relating to Modification 8 is a power circuit built-in LED unit (light engine). The lighting apparatus 900 includes the light emitting module 100 relating to the above embodiment, a mounting member 910, a case 920, cover 930, heat conductive sheets 940 and 950, fixing screws 960, a reflecting mirror 970, and a circuit unit 980.

As shown in FIG. 17, the mounting member 910 functions as a fixing member for fixing the lighting apparatus 900 to an apparatus mounting surface (not illustrated). The mounting member 910 also functions as a seat to which the substrate 110 on which the light emitting module 100 is mounted is to be attached. The mounting member 910 is for example formed from a high heat conductive material such as an aluminum.

The case 920 is a cylindrical housing that encircles the light emitting module 100, and has an opening on a light emission side. The case 920 is for example formed from an insulating synthetic resin such as a PBT. As shown in FIG. 17, the case 920 houses therein the light emitting module 100, the heat conductive sheet 940, the reflecting mirror 970, and the circuit unit 980.

The cover 930 is a member for protecting the light emitting module 100 and so on, which are housed in the case 920. The cover 930 is attached to the case 920 with use of an adhesive, rivets, screws, or the like so as to close the opening of the case 920 which is positioned on the light emission side. The cover 930 is formed from a translucent synthetic resin such as a polycarbonate resin such that light emitted from the light emitting module 100 efficiently transmits through the cover 930. The inside of the case 920 is visible through the cover 930. FIG. 18 shows the lighting apparatus 900 from which the cover 930 is removed such that the inside of the case 920 is easily understandable. As found from FIG. 18, light emitting parts 101W, 101R, and 101G constituting the light emitting module 100, a frame 160, an optical member assembly 180, and so on are visible through the cover 930.

The heat conductive sheet 940 is disposed between the light emitting module 100 and the mounting member 910. The heat conductive sheet 940 thermally connects the substrate 110 and the mounting member 910 with each other. The heat conductive sheet 940 is for example a silicone rubber sheet, an acrylic sheet, or the like, and efficiently conducts heat generated from the light emitting module 100 to the mounting part 910.

The heat conductive sheet 950 is disposed between the mounting member 910 and the apparatus mounting surface. The heat conductive sheet 950 is also for example a silicone rubber sheet, an acrylic sheet, or the like. The heat conductive sheet 950 transfers heat, which is generated from the light emitting module 100 and is conducted to the heat conductive sheet 950 via the heat conductive sheet 940 and the mounting member 910, to the apparatus mounting surface.

As shown in FIG. 16, the mounting part member 910 and the case 920 are fixed to each other by the fixing screws 960.

The reflecting mirror 970 is an optical member for efficiently extracting light emitted from the light emitting module 100 externally. The reflecting mirror 970 is tubular, and has a diameter that increases toward the cover 930. The reflecting mirror 970 is formed from a high reflective material such as a polycarbonate. Note that an inner surface of the reflecting mirror 970 may be coated with a reflective film in order to improve the reflectivity.

The circuit unit 980 includes a circuit substrate and a plurality of electronic components (not illustrated) that are mounted on the circuit substrate. The circuit unit 980 is circularly annular and has a circular opening. The circuit unit 980 is disposed in a space on an outer periphery of the reflecting mirror 970 in the case 920.

(Lighting Fixture)

The lighting fixture relating to the present invention is not limited to the lighting fixture 1 relating to the above embodiment.

For example, the light emitting module is incorporated into the lighting fixture relating to the above embodiment as part of the lighting apparatus. Alternatively, the light emitting module may be incorporated directly into the lighting fixture not as part of the lighting apparatus but as a single component.

(Others)

Although the structure of the present invention has been described based on the above embodiment and modifications, the structure of the present invention is not limited to those of the above embodiment and modifications. The structure of the present invention may be for example an appropriate combination of partial structures of the above embodiment and modifications. Also, the materials, the numerical values, and so on described in the above embodiment are just preferable examples, and accordingly the present invention is not limited by those described in the above embodiment. Furthermore, the structure of the present invention may be appropriately modified without departing from the scope of the technical ideas of the present invention. The present invention is broadly utilizable to general intended purpose of lighting.

REFERENCE SIGNS LIST 1 lighting fixture
10 lighting apparatus
100 light emitting module
101W, 101R, and 101G light emitting part
110 substrate
111 upper surface
120W, 120R, and 120G light emitting element
121W, 121R, and 121G upper surface
130W, 130R, and 130G sealing member
131W, 131R, and 131G surface
170 optical member
171 side surface
172 upper surface
173 lower surface

What is claimed is:

1. A light emitting module comprising:
a substrate;
a first linear light emitting part on an upper surface of the substrate, the first linear light emitting part including a plurality of first light emitting elements linearly arranged and a first linear sealing member sealing the plurality of the first light emitting elements on the substrate;
a second linear light emitting part on the upper surface of the substrate, the second linear light emitting part including a plurality of second light emitting elements linearly arranged on the substrate and a second linear sealing member sealing the plurality of the second light emitting elements on the substrate; and
an optical member interposed between the first linear light emitting part and the second linear light emitting part that are provided at spaced intervals on the substrate, wherein
the first linear light emitting part and the second light emitting part differ from each other in terms of luminescent color,
the first linear sealing member and the second linear sealing member are each composed of a translucent material that is mixed with a phosphor,
a translucent material defining the optical member differs from each of the respective translucent materials defining the first linear sealing member and the second linear sealing member in terms of refractive index by 0.04 or less, and
a side surface of the optical member includes a first region facing the first linear sealing member and a second region facing the second linear sealing member, the first region is at least partially in contact with a surface of the first linear sealing member, and the second region is at least partially in contact with a surface of the second linear sealing member.

2. The light emitting module of claim 1, wherein
the first region included in the side surface of the optical member is entirely in surface contact with the surface of the first linear sealing member such that no gap is provided between the first region and the surface of the first linear sealing member, and
the second region included in the side surface of the optical member is entirely in surface contact with the surface of the second linear sealing member such that no gap is provided between the second region and the surface of the second linear sealing member.

3. The light emitting module of claim 1, wherein
in a range between the first linear sealing member and the second linear sealing member, a lower surface of the optical member is in surface contact with the upper surface of the substrate such that no gap is provided between the lower surface of the optical member and the upper surface of the substrate.

4. The light emitting module of claim 1, wherein
the translucent material defining the optical member is mixed with a light-scattering material.

5. The light emitting module of Claim 1, wherein
the optical member, the first linear sealing member, and the second linear sealing member are composed of the same translucent material.

6. The light emitting module of claim 1, wherein
the optical member is composed of a translucent material having a refractive index higher than air.

7. The light emitting module of claim 1, wherein
in planar view, an upper surface of the first linear light emitting part and an upper surface of the second linear light emitting part extend beyond an upper surface of the optical member.

8. The light emitting module of claim 1, wherein
a length of the first linear light emitting part and a length of the second linear light emitting part are on the same, and respective ends of the first linear light emitting part and the second linear light emitting part are aligned with each other.

9. The light emitting module of claim 1, further comprising:
a frame provided on the upper surface of the substrate, wherein
the frame surrounds the first linear light emitting part and the second linear light emitting part, and
the optical member is disposed in an internal region of the frame.

10. The light emitting module of claim 9, wherein
a height of the frame is greater than a height of the optical member, and the height of the frame is equal to a height of the first linear light emitting part and the second linear light emitting part.

11. The light emitting module of claim 1, further comprising:
a circuit unit that supplies an electrical current to the first linear light emitting part and the second linear light emitting part, wherein
the first linear light emitting part and the second linear light emitting part are electrically parallel-connected to each other.

12. A lighting apparatus comprising the light emitting module of claim 1.

13. A lighting fixture comprising the light emitting module of claim 1.

14. A light emitting module comprising:
a substrate;
a first linear light emitting part on an upper surface of the substrate, the first linear light emitting part including a plurality of first light emitting elements linearly arranged and a first linear sealing member sealing the plurality of the first light emitting elements on the substrate;
a second linear light emitting part on the upper surface of the substrate, the second linear light emitting part including a plurality of second light emitting elements linearly arranged on the substrate and a second linear sealing member sealing the plurality of the second light emitting elements on the substrate; and
an optical member interposed between the first linear light emitting part and the second linear light emitting part that are provided at spaced intervals on the substrate, wherein
the first linear light emitting part and the second light emitting part differ from each other in terms of luminescent color,
the first linear light emitting part emits white light and the second linear light emitting part emits non-white light, and
a side surface of the optical member includes a first region facing the first linear sealing member and a second region facing the second linear sealing member, the first region is at least partially in contact with a surface of the first linear sealing member, and the second region is at least partially in contact with a surface of the second linear sealing member.

15. The light emitting module of claim 14, wherein
the first region included in the side surface of the optical member is entirely in surface contact with the surface of the first linear sealing member such that no gap is provided between the first region and the surface of the first linear sealing member, and
the second region included in the side surface of the optical member is entirely in surface contact with the surface of the second linear sealing member such that no gap is provided between the second region and the surface of the second linear sealing member.

16. The light emitting module of claim 14, wherein
in a range between the first linear sealing member and the second linear sealing member, a lower surface of the optical member is in surface contact with the upper surface of the substrate such that no gap is provided between the lower surface of the optical member and the upper surface of the substrate.

17. The light emitting module of claim 14, wherein
the translucent material defining the optical member is mixed with a light-scattering material.

18. The light emitting module of claim 14, wherein
the optical member is composed of a translucent material having a refractive index higher than air.

19. The light emitting module of claim 14, wherein
in planar view, an upper surface of the first linear light emitting part and an upper surface of the second linear light emitting part extend beyond an upper surface of the optical member.

20. The light emitting module of claim 14, wherein
a length of the first linear light emitting part and a length of the second linear light emitting part are on the same, and respective ends of the first linear light emitting part and the second linear light emitting part are aligned with each other.

21. The light emitting module of claim 14, further comprising:
a frame provided on the upper surface of the substrate, wherein
the frame surrounds the first linear light emitting part and the second linear light emitting part, and
the optical member is disposed in an internal region of the frame.

22. The light emitting module of claim 21, wherein
a height of the frame is greater than a height of the optical member, and the height of the frame is equal to a height of the first linear light emitting part and the second linear light emitting part.

23. The light emitting module of claim 14, further comprising:
a circuit unit that supplies an electrical current to the first linear light emitting part and the second linear light emitting part, wherein
the first linear light emitting part and the second linear light emitting part are electrically parallel-connected to each other.

24. A lighting apparatus comprising the light emitting module of claim 14.

25. A lighting fixture comprising the light emitting module of claim 12.

26. A light emitting module comprising a first light emitting part and a second light emitting part that are provided at spaced intervals from one another on an upper surface of a substrate, the first light emitting part emitting light of white color and including a first light emitting element and a first sealing member sealing the first light emitting element, the second light emitting part emitting light of a color other than the white color and including a second light emitting element and a second sealing member sealing the second light emitting element, wherein
- an optical member is interposed between the first light emitting part and the second light emitting part, and is formed from a translucent material having a refractive index higher than air,
- a side surface of the optical member includes a first region facing the first sealing member and a second region facing the second sealing member, the first region is at least partially in contact with a surface of the first sealing member, and the second region is at least partially in contact with a surface of the second sealing member, and
- in plan view, an upper surface of the optical member does not substantially overlap either an upper surface of the first light emitting element or an upper surface of the second light emitting element, wherein
- the first linear light emitting part emits white light and the second linear light emitting part emits non-white light.

27. The light emitting module of claim 26, further comprising:
- a circuit unit that supplies an electrical current to the first light emitting part and the second light emitting part, wherein
- the first light emitting part and the second light emitting part are electrically parallel-connected to each other.

28. The light emitting module of claim 26, wherein
- the first linear sealing member and the second linear sealing member are each composed of a translucent material that is mixed with a phosphor, and
- the translucent material defining the optical member differs from each of the respective translucent materials defining the first linear sealing member and the second linear sealing member in terms of refractive index by 0.04 or less.

29. A lighting apparatus comprising the light emitting module of claim 26.

30. A lighting fixture comprising the light emitting module of claim 26.

* * * * *